US011973509B2

(12) United States Patent
Srinivasan et al.

(10) Patent No.: US 11,973,509 B2
(45) Date of Patent: Apr. 30, 2024

(54) FAST FREQUENCY SYNTHESIZER SWITCHING

(71) Applicant: Silicon Laboratories Inc., Austin, TX (US)

(72) Inventors: Rangakrishnan Srinivasan, Austin, TX (US); Zhongda Wang, San Jose, CA (US); Francesco Barale, North Kingstown, RI (US); Wenhuan Yu, Austin, TX (US); Mustafa H. Koroglu, Austin, TX (US); Yan Zhou, Spicewood, TX (US); Terry L. Dickey, Pflugerville, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/709,642

(22) Filed: Mar. 31, 2022

(65) Prior Publication Data

US 2023/0318609 A1 Oct. 5, 2023

(51) Int. Cl.
*H03L 7/107* (2006.01)
*H03L 7/099* (2006.01)
*H04B 1/40* (2015.01)

(52) U.S. Cl.
CPC ............ *H03L 7/1075* (2013.01); *H03L 7/099* (2013.01); *H04B 1/40* (2013.01)

(58) Field of Classification Search
CPC . H03L 7/099; H03L 7/10; H03L 7/101; H03L 7/102; H03L 7/104; H03L 7/105; H03B 5/04

See application file for complete search history.

(56) References Cited

U.S. PATENT DOCUMENTS

| | | | |
|---|---|---|---|
| 7,961,055 B2 | 6/2011 | Miyata et al. | |
| 8,531,245 B2 * | 9/2013 | Joubert | H03L 1/023 |
| | | | 331/10 |
| 8,558,624 B2 | 10/2013 | Raita | |
| 10,367,462 B2 | 7/2019 | Marques | |

(Continued)

OTHER PUBLICATIONS

Anderton, J., "Solving the Challenge of Many Devices with Multiple Standards in the Connected Home," Qorvo White Paper, Dec. 2021, 6 pages.

(Continued)

*Primary Examiner* — Diana J. Cheng
(74) *Attorney, Agent, or Firm* — Zagorin Cave LLP

(57) ABSTRACT

A phase-locked loop (PLL) that provides a local oscillator signal for a radio. An oscillator of the PLL supplies an oscillator output signal. Control logic receives a request to change the oscillator output signal to a new frequency and responds to the request by setting a first capacitor circuit of the oscillator to a first capacitance that corresponds to a predetermined frequency of the oscillator output signal. The control logic also responds to the request by setting one or more other capacitor circuits of the oscillator according to temperature and according to a frequency difference between the predetermined frequency and the new frequency. After responding to the request by setting the first capacitor circuit and the one or more other capacitor circuits, the PLL locks to the new frequency using a signal from the PLL loop filter to adjust another capacitor circuit in the oscillator.

22 Claims, 14 Drawing Sheets

(56) References Cited

U.S. PATENT DOCUMENTS

| | | |
|---|---|---|
| 10,454,420 B2 | 10/2019 | Marques |
| 10,491,157 B1 | 11/2019 | Pereira et al. |
| 10,536,115 B2 | 1/2020 | Marques et al. |
| 10,574,185 B2 | 2/2020 | Marques et al. |
| 10,601,369 B2 | 3/2020 | Marques et al. |
| 10,763,837 B2 | 9/2020 | Casagrande |
| 2008/0042755 A1 | 2/2008 | Feygin et al. |
| 2019/0068153 A1 | 2/2019 | Arslan et al. |
| 2020/0014390 A1 | 1/2020 | Aboudina et al. |
| 2020/0343856 A1 | 10/2020 | Aboudina et al. |

OTHER PUBLICATIONS

Esmaeelzadeh, H., and Pamarti, S., "A Quick Startup Technique for High-Q Oscillators Using Precisely Timed Energy Injection," IEEE Journal of Solid-State Circuits, vol. 53, No. 3, Mar. 2018, pp. 692-702.

Megawer, K., et al., "A Fast Startup CMOS Crystal Oscillator Using Two-Step Injection," IEEE Journal of Solid-State Circuits, vol. 54, No. 12, Dec. 2019, pp. 3257-3268.

Silicon Labs, "AN0016.0: Oscillator Design Considerations," Rev. 1.30, downloaded from http://www.silabs.com on May 5, 2022, 18 pages.

Silicon Labs, "UG103.16: Multiprotocol Fundamentals," Rev. 0.03, downloaded from www.silabs.com on Nov. 4, 2021, 7 pages.

Silicon Labs, "UG305: Dynamic Multiprotocol User's Guide," Rev. 1.0, downloaded from http://www.silabs.com on Oct. 1, 2021, 37 pages.

\* cited by examiner

| TEMP | FVCO MHz | DCAP CODE | DeltaF MHz | K_VCO MHz/V | DeltaV_Temp V | TCAP CODE | DeltaV_TCAP V | Vctrl V | TCOMP OFFSET |
|---|---|---|---|---|---|---|---|---|---|
| -39 | 4895.63 |  | 15.63 | -30 | 0.52 | 16 | 0.00 | 1.37 | 0 |
| -7 | 4887.81 |  | 7.81 | -30 | 0.26 | 16 | 0.00 | 1.11 | 0 |
| 25 | 4880.00 | BASE |  | -30 |  | 16 | 0.00 | 0.85 | 0 |
| 57 | 4872.19 |  | -7.81 | -30 | -0.26 | 16 | 0.00 | 0.59 | 0 |
| 89 | 4864.40 |  | -15.60 | -30 | -0.52 | 16 | 0.00 | 0.33 | 0 |
| 121 | 4856.61 |  | -23.39 | -30 | -0.78 | 16 | 0.00 | 0.07 | 0 |

FIG. 7

| TEMP | FVCO MHz | DCAP CODE | DeltaF MHz | K_VCO MHz/V | DeltaV_Temp V | TCAP CODE | DeltaV_TCAP V | Vctrl V | TCOMP OFFSET |
|---|---|---|---|---|---|---|---|---|---|
| -39 | 4895.63 |  | 15.63 | -30 | 0.52 | 18 | -0.42 | 0.95 | 2 |
| -7 | 4887.81 |  | 7.81 | -30 | 0.26 | 17 | -0.21 | 0.90 | 1 |
| 25 | 4880.00 | BASE |  | -30 |  | 16 |  | 0.85 | 0 |
| 57 | 4872.19 |  | -7.81 | -30 | -0.26 | 15 | 0.21 | 0.80 | -1 |
| 89 | 4864.40 |  | -15.60 | -30 | -0.52 | 14 | 0.42 | 0.75 | -2 |
| 121 | 4856.61 |  | -23.39 | -30 | -0.78 | 13 | 0.63 | 0.70 | -3 |

FIG. 8

Vctrl vs. FLO with "BASE only at 2440 MHz"

| FLO | PROTOCOL | CHANNEL | CHANNEL | DCAP CODE | LOCAP CODE | DeltaFVCO Freq | KVCO MHz/V | DeltaV_FLO V | Vctrl V |
|---|---|---|---|---|---|---|---|---|---|
| 2405 | Zigbee | DATA | 11 | | 16 | -70 | -30 | 2.33 | 3.18 |
| 2410 | Zigbee | DATA | 12 | | 16 | -60 | -30 | 2.00 | 2.85 |
| 2415 | Zigbee | DATA | 13 | | 16 | -50 | -30 | 1.67 | 2.52 |
| 2420 | Zigbee | DATA | 14 | | 16 | -40 | -30 | 1.33 | 2.18 |
| 2425 | Zigbee | DATA | 15 | | 16 | -30 | -30 | 1.00 | 1.85 |
| 2430 | Zigbee | DATA | 16 | | 16 | -20 | -30 | 0.67 | 1.52 |
| 2435 | Zigbee | DATA | 17 | | 16 | -10 | -30 | 0.33 | 1.18 |
| 2440 | Zigbee | DATA | 18 | BASE | 16 | | -30 | | 0.85 |
| 2445 | Zigbee | DATA | 19 | | 16 | 10 | -30 | -0.33 | 0.52 |
| 2450 | Zigbee | DATA | 20 | | 16 | 20 | -30 | -0.67 | -0.18 |
| 2455 | Zigbee | DATA | 21 | | 16 | 30 | -30 | -0.15 | -0.15 |
| 2460 | Zigbee | DATA | 22 | | 16 | 40 | -30 | -1.33 | -0.48 |
| 2465 | Zigbee | DATA | 23 | | 16 | 50 | -30 | -1.67 | -0.82 |
| 2470 | Zigbee | DATA | 24 | | 16 | 60 | -30 | -2.00 | -1.15 |
| 2575 | Zigbee | DATA | 25 | | 16 | 70 | -30 | -2.33 | -1.48 |
| 2480 | Zigbee | DATA | 26 | | 16 | 80 | -30 | -2.67 | -1.82 |

FIG. 10

Vctrl vs. FLO with BASE only at 2440 MHz + LOCOMP

| DCAP CODE | DeltaFVCO Freq | KVCO MHz/V | DeltaV_FLO | LOCAP CODE | DeltaV_LOCAP V | Vctrl V | LOCOMP Offset |
|---|---|---|---|---|---|---|---|
| | -70 | -30 | 2.33 | 27 | -2.29 | 0.89 | 11 |
| | -60 | -30 | 2.00 | 25 | -1.88 | 0.98 | 9 |
| | -50 | -30 | 1.67 | 24 | -1.67 | 0.85 | 8 |
| | -40 | -30 | 1.33 | 22 | -1.25 | 0.93 | 6 |
| | -30 | -30 | 1.00 | 20 | -0.83 | 1.02 | 4 |
| | -20 | -30 | 0.67 | 19 | -0.63 | 0.89 | 3 |
| | -10 | -30 | 0.33 | 17 | -0.21 | 0.98 | 1 |
| BASE | | -30 | | 16 | | 0.85 | 0 |
| | 10 | -30 | -0.33 | 15 | 0.21 | 0.73 | -1 |
| | 20 | -30 | -0.67 | 13 | 0.63 | 0.81 | -3 |
| | 30 | -30 | -1.00 | 12 | 0.83 | 0.68 | -4 |
| | 40 | -30 | -1.33 | 10 | 1.25 | 0.77 | -6 |
| | 50 | -30 | -1.67 | 8 | 1.67 | 0.85 | -8 |
| | 60 | -30 | -2.00 | 7 | 1.88 | 0.73 | -9 |
| | 70 | -30 | -2.33 | 5 | 2.29 | 0.81 | -11 |
| | 80 | -30 | -2.67 | 4 | 2.50 | 0.68 | -12 |

FIG. 11

Vctrl VS. FLO WITH BASE ONLY AT 2440 MHz FLO COMPENSATION (LOCOMP) FOR BLE

| FLO | PROTOCOL | TYPE | CHANNEL | DCAP CODE | LOCAP CODE | DeltaFVCO FREQ | Kvco MHz/V | DeltaV_FLO V | Vctrl V |
|---|---|---|---|---|---|---|---|---|---|
| 2402 | BLE | ADV1 | 0 | | 16 | -76 | -30 | 2.53 | 3.38 |
| 2404 | BLE | DATA | 1 | | 16 | -72 | -30 | 2.40 | 3.25 |
| 2406 | BLE | DATA | 2 | | 16 | -68 | -30 | 2.27 | 3.12 |
| 2408 | BLE | DATA | 3 | | 16 | -64 | -30 | 2.13 | 2.98 |
| 2410 | BLE | DATA | 4 | | 16 | -60 | -30 | 2.00 | 2.85 |
| 2412 | BLE | DATA | 5 | BASE | 16 | -56 | -30 | 1.87 | 2.72 |
| 2414 | BLE | DATA | 6 | | 16 | -52 | -30 | 1.73 | 2.58 |
| 2416 | BLE | DATA | 7 | | 16 | -48 | -30 | 1.60 | 2.45 |
| 2418 | BLE | DATA | 8 | | 16 | -44 | -30 | 1.47 | 2.32 |
| 2420 | BLE | DATA | 9 | | 16 | -40 | -30 | 1.33 | 2.18 |
| 2422 | BLE | DATA | 10 | | 16 | -36 | -30 | 1.20 | 2.05 |
| 2424 | BLE | DATA | 11 | | 16 | -32 | -30 | 1.07 | 1.92 |
| 2426 | BLE | ADV2 | 12 | | 16 | -28 | -30 | 0.93 | 1.78 |
| 2428 | BLE | DATA | 13 | | 16 | -24 | -30 | 0.80 | 1.65 |
| 2430 | BLE | DATA | 14 | | 16 | -20 | -30 | 0.67 | 1.52 |
| 2432 | BLE | DATA | 15 | | 16 | -16 | -30 | 0.53 | 1.38 |
| 2434 | BLE | DATA | 16 | | 16 | -12 | -30 | 0.40 | 1.25 |
| 2436 | BLE | DATA | 17 | | 16 | -8 | -30 | 0.27 | 1.12 |

FROM FIG. 13A

| | | | | | BASE | | |
|---|---|---|---|---|---|---|---|
| 2438 | BLE | DATA | 18 | 16 | -4 | -30 | | 0.98 |
| 2440 | BLE | DATA | 19 | 16 | | -30 | 0.13 | 0.85 |
| 2442 | BLE | DATA | 20 | 16 | 4 | -30 | | 0.72 |
| 2444 | BLE | DATA | 21 | 16 | 8 | -30 | -0.13 | 0.58 |
| 2446 | BLE | DATA | 22 | 16 | 12 | -30 | -0.27 | 0.45 |
| 2448 | BLE | DATA | 23 | 16 | 16 | -30 | -0.40 | 0.32 |
| 2450 | BLE | DATA | 24 | 16 | 20 | -30 | -0.53 | 0.18 |
| 2452 | BLE | DATA | 25 | 16 | 24 | -30 | -0.67 | 0.05 |
| 2454 | BLE | DATA | 26 | 16 | 28 | -30 | -0.80 | -0.08 |
| 2456 | BLE | DATA | 27 | 16 | 32 | -30 | -0.93 | -0.22 |
| 2458 | BLE | DATA | 28 | 16 | 36 | -30 | -1.07 | -0.35 |
| 2460 | BLE | DATA | 29 | 16 | 40 | -30 | -1.20 | -0.48 |
| 2462 | BLE | DATA | 30 | 16 | 44 | -30 | -1.33 | -0.62 |
| 2464 | BLE | DATA | 31 | 16 | 48 | -30 | -1.47 | -0.75 |
| 2466 | BLE | DATA | 32 | 16 | 52 | -30 | -1.60 | -0.88 |
| 2468 | BLE | DATA | 33 | 16 | 56 | -30 | -1.73 | -1.02 |
| 2470 | BLE | DATA | 34 | 16 | 60 | -30 | -1.87 | -1.15 |
| 2472 | BLE | DATA | 35 | 16 | 64 | -30 | -2.00 | -1.28 |
| 2474 | BLE | DATA | 36 | 16 | 68 | -30 | -2.13 | -1.42 |
| 2476 | BLE | DATA | 37 | 16 | 72 | -30 | -2.27 | -1.55 |
| 2478 | BLE | DATA | 38 | 16 | 76 | -30 | -2.40 | -1.68 |
| 2480 | BLE | ADV3 | 39 | 16 | 80 | -30 | -2.53 | -1.82 |
| | | | | | | | -2.67 | |

FIG. 14

FLO COMPENSATION (LOCOMP) FOR BLE

| DCAP CODE | DeltaFVCO FREQ | Kvco MHz/V | DeltaV_FLO V | LOCAP CODE | DeltaV_LOCAP V | Vctrl V | LOCOMP OFFSET |
|---|---|---|---|---|---|---|---|
| | -76 | -30 | 2.53 | 28 | -2.50 | 0.88 | 12 |
| | -72 | -30 | 2.40 | 27 | -2.29 | 0.96 | 11 |
| | -68 | -30 | 2.27 | 26 | -2.08 | 1.03 | 10 |
| | -64 | -30 | 2.13 | 26 | -2.08 | 0.90 | 10 |
| | -60 | -30 | 2.00 | 25 | -1.88 | 0.98 | 9 |
| | -56 | -30 | 1.87 | 24 | -1.67 | 1.05 | 8 |
| | -52 | -30 | 1.73 | 24 | -1.67 | 0.92 | 8 |
| | -48 | -30 | 1.60 | 23 | -1.46 | 0.99 | 7 |
| | -44 | -30 | 1.47 | 23 | -1.46 | 0.86 | 7 |
| | -40 | -30 | 1.33 | 22 | -1.25 | 0.93 | 6 |
| | -36 | -30 | 1.20 | 21 | -1.04 | 1.01 | 5 |
| | -32 | -30 | 1.07 | 21 | -1.04 | 0.88 | 5 |
| | -28 | -30 | 0.93 | 20 | -0.83 | 0.95 | 4 |
| | -24 | -30 | 0.80 | 19 | -0.63 | 1.03 | 3 |
| | -20 | -30 | 0.67 | 19 | -0.63 | 0.89 | 3 |
| | -16 | -30 | 0.53 | 18 | -0.42 | 0.97 | 2 |
| | -12 | -30 | 0.40 | 17 | -0.21 | 1.04 | 1 |
| | -8 | -30 | 0.27 | 17 | -0.21 | 0.91 | 1 |
| | -4 | -30 | 0.13 | 16 | | 0.98 | 0 |
| BASE | | | | 16 | | 0.85 | 0 |
| | 4 | -30 | -0.13 | 16 | | 0.72 | 0 |
| | 8 | -30 | -0.27 | 15 | 0.21 | 0.79 | -1 |
| | 12 | -30 | -0.40 | 15 | 0.21 | 0.66 | -1 |
| | 16 | -30 | -0.53 | 14 | 0.42 | 0.73 | -2 |
| | 20 | -30 | -0.67 | 13 | 0.63 | 0.81 | -3 |
| | 24 | -30 | -0.80 | 13 | 0.63 | 0.68 | -3 |
| | 28 | -30 | -0.93 | 12 | 0.83 | 0.75 | -4 |
| | 32 | -30 | -1.07 | 11 | 1.04 | 0.83 | -5 |
| | 36 | -30 | -1.20 | 11 | 1.04 | 0.69 | -5 |
| | 40 | -30 | -1.33 | 10 | 1.25 | 0.77 | -6 |
| | 44 | -30 | -1.47 | 9 | 1.46 | 0.84 | -7 |
| | 48 | -30 | -1.60 | 9 | 1.46 | 0.71 | -7 |
| | 52 | -30 | -1.73 | 8 | 1.67 | 0.78 | -8 |
| | 56 | -30 | -1.87 | 8 | 1.67 | 0.65 | -8 |
| | 60 | -30 | -2.00 | 7 | 1.88 | 0.73 | -9 |
| | 64 | -30 | -2.13 | 6 | 2.08 | 0.80 | -10 |
| | 68 | -30 | -2.27 | 6 | 2.08 | 0.67 | -10 |
| | 72 | -30 | -2.40 | 5 | 2.29 | 0.74 | -11 |
| | 76 | -30 | -2.53 | 4 | 2.50 | 0.82 | -12 |
| | 80 | -30 | -2.67 | 4 | 2.50 | 0.68 | -12 |

FAST FREQUENCY SYNTHESIZER SWITCHING

BACKGROUND

Field of the Invention

This application relates to wireless technology and more particularly to a frequency synthesizer that attains fast lock or fast switching between frequencies.

Description of the Related Art

Internet of Things (IoT) radio-based products often need to operate at the same time on multiple wireless protocols such as IEEE 802.15.4 (Zigbee™ and OpenThread) and Bluetooth® Low Energy/Bluetooth (BLE/BT) Mesh and/or on multiple frequencies. Prior solutions have been to integrate two or more radios or use Dynamic Multi-Protocol (DMP), which is software that switches between multiple protocols using time multiplexing. Use of multiple radios increases product size and cost (multiple or larger integrated circuits, more antennas, increased external bill of materials (BOM), etc.) and DMP cannot support more than one protocol requiring near 100% receive (RX) listening. Current DMP solutions can only handle the BLE Connection interval case with the rest of the time spent on 802.15.4 unknown RX arrival listening. Switching between frequencies can be time consuming, which reduces the time available for listening to different frequencies.

It would be desirable to provide a better solution for switching between frequencies in the PLL-based frequency synthesizer.

SUMMARY OF EMBODIMENTS OF THE INVENTION

In an embodiment a method includes receiving a request for an oscillator of a phase-locked loop (PLL) to generate an oscillator output signal having a first frequency. A first frequency control parameter of the oscillator is set to a first value corresponding to a predetermined frequency responsive to the request and one or more second frequency control parameters of the oscillator are set to a second value according to a frequency difference between the predetermined frequency and the first frequency and according to a measured temperature.

In another embodiment an apparatus includes a phase-locked loop that includes an oscillator. The oscillator generates an oscillator output signal with a first frequency. Control logic receives a request to change the oscillator output signal to a second frequency. The oscillator includes a first capacitor circuit and a second capacitor circuit. The second capacitor circuit is formed of one or more capacitor arrays. The control logic responds to the request by setting the first capacitor circuit to a first capacitance, the first capacitance corresponding to a predetermined frequency and the control logic also responds to the request by setting the second capacitor circuit to a second capacitance, the second capacitance being determined according to a frequency difference between the predetermined frequency and the second frequency and according to a measured temperature.

In another embodiment an apparatus includes a phase-locked loop that includes an oscillator. Control logic receives a request to cause the oscillator to supply an oscillator output signal with a desired frequency. A first capacitor circuit is coupled to a first control signal. A second capacitor circuit is coupled to a second control signal. A third capacitor circuit is coupled to a third control signal. A fourth capacitor circuit is coupled to an output of a loop filter. The control logic is responsive to the request to set the first control signal to a first value corresponding to a first capacitance that corresponds to a predetermined frequency of the oscillator output signal, and the control logic is responsive to the request to set the second control signal to a second value corresponding to a second capacitance determined according to a measured temperature. The control logic is further responsive to the request to set the third control signal to a third control value corresponding to a third capacitance determined according to a frequency difference between the predetermined frequency and the desired frequency. With the first capacitor circuit, the second capacitor circuit, and the third capacitor circuit configured according to the first control signal, the second control signal, and the third control signal, respectively, the phase-locked loop tunes to the desired frequency by adjusting a fourth capacitance of the fourth capacitor circuit with the fourth control signal.

BRIEF DESCRIPTION OF THE DRAWINGS

The present invention may be better understood, and its numerous objects, features, and advantages made apparent to those skilled in the art by referencing the accompanying drawings.

FIG. 7 illustrates why temperature compensation (TCOMP) is required to maintain Vctrl within its tuning range limits over the entire temperature range.

FIG. 8 illustrates temperature compensation and how the use of the TCAP array ensures Vctrl remains within tuning range of the VCO over the entire temperature range.

FIG. 10 illustrates why local oscillator compensation is required to maintain Vctrl within its tuning range limits when the local oscillator hops from one Zigbee frequency to another.

FIG. 11 illustrates how the use of local oscillator compensation with the LOCAP capacitor array ensures that Vctrl remains within tuning range for Zigbee channel changes.

FIGS. 13A and 13B illustrates why local oscillator compensation (LOCOMP) is required to maintain Vctrl within its tuning range limits when the local oscillator hops from one BLE frequency to another.

FIG. 14 illustrates how the use of local oscillator compensation (LOCOMP) with the LOCAP capacitor array ensures that Vctrl remains within tuning range for BLE channel changes.

The use of the same reference symbols in different drawings indicates similar or identical items.

DETAILED DESCRIPTION

Embodiments described herein support IoT concurrent listening by providing a fast-switching frequency synthesizer for dynamic multi-protocol, multi-channel receiver that can quickly shift between receive frequencies. That provides a substantial improvement over DMP, but without the increased cost of multiple IoT radios. Thus, embodiments provide significant performance improvement in monitoring both 802.15.4 unknown RX arrival listening and BLE/BT Mesh unknown RX arrival on BLE advertising (ADV) channels. Embodiments described herein support background concurrent listening to 16 Zigbee receive (RX) channels (2405 to 2480 MHz spaced 5 MHz apart) and BLE advertising channels (2402, 2426, and 2480 MHz) as well as BLE data channels (2402 to 2480 MHz spaced 2 MHz apart and not advertising channels). With the fast-switching synthesizer approaches described herein, the RF frequency synthesizer can settle to an 802.15.4 RX channel or any BLE channel (to include ADV channels and DATA channels that can be used as advertising channels with Wake-up radio applications) in, e.g., less than 10 µs. Note that Zigbee transmit and BLE DATA are schedulable and pre-empt background listening. Note also that the particular switching speed between channels depends on how a particular embodiment is implemented and the switching speed requirements of a particular application.

Figure 1:
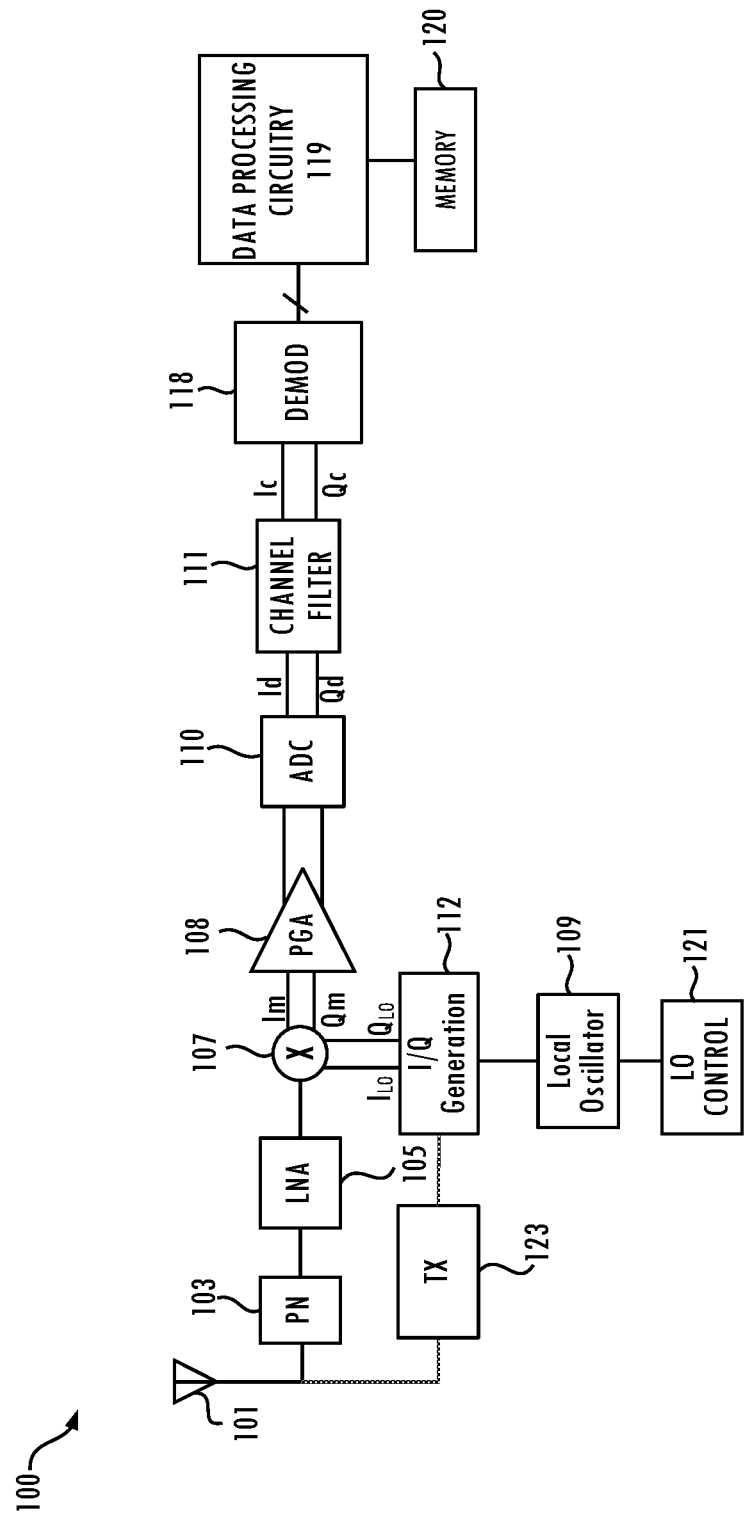
FIG. 1 illustrates a wireless communication device that includes a fast-switching frequency synthesizer.

FIG. 1 illustrates a block diagram of an embodiment of a receiver 100 included in a wireless communications device that includes a fast-switching frequency synthesizer. Antenna 101 provides an RF signal to passive network (PN) 103 that provides impedance matching, filtering, and electrostatic discharge protection. Low-noise amplifier (LNA) 105 amplifies the signals from passive network 103 without substantial degradation to the signal-to-noise ratio and provides the amplified RF signals to mixer 107. Mixer 107 performs frequency translation or shifting of the RF signals, using local oscillator (LO) signal(s) provided by I/Q generation block 112, which is supplied from a local oscillator 109 implemented as a fast-switching frequency synthesizer. The I/Q generation block 112 converts the local oscillator signal from local oscillator 109 to I and Q signals for the RX mixer 107 and the transmit (TX) mixer (not shown separately in TX block 123). Details of the fast-switching frequency synthesizer are provided herein. In various embodiments receiver 100 is configured as an intermediate frequency receiver, a low-intermediate frequency (LIF receiver), or a zero IF receiver, according to the type of radio signals being received.

Mixer 107 provides the down converted output signal as a set of two signals, an in-phase (Im) signal, and a quadrature (Qm) signal to programmable gain amplifiers (PGA) 108. The Im and Qm signals are analog time-domain signals. In at least one embodiment of receiver 100, the analog amplifiers 108 and filters (not separately illustrated) provide amplified and filtered version of the Im and Qm signals to an analog-to-digital converter (ADC) 110, which converts those versions of the Im and Qm signals to digital Id and Qd signals. Exemplary embodiments of ADC 110 use a variety of signal conversion techniques (e.g., delta-sigma (or sigma-delta) analog-to-digital conversion). ADC 110 provides digital Id and Qd signals to channel filters 111, which provides digital filtering of the digital Id and Qd signals and provides the filtered Ic and Qc signals to the demodulator 118. The demodulator 118 performs demodulation of the digital Ic and Qc signals to retrieve or extract information, such as data signals, that were modulated (e.g., in a transmitter (not shown)), and transmitted to antenna 101 as RF signals. The demodulator 118 provides the demodulated data to the data processing circuitry 119. In embodiments data processing circuitry 119 performs a variety of functions (e.g., logic, arithmetic, etc.). For example, data processing circuitry 119 uses the demodulated data in a program, routine, or algorithm (whether in software, firmware, hardware, or a combination) to perform desired control or data processing tasks. In an embodiment, the data processing circuitry includes a processor such as a microcontroller and software and/or firmware to perform the desired functions. The memory 120 stores software and firmware for use by data processing circuitry 119 to perform various tasks and stores data supplied to or from data processing circuitry 119. The memory 120 may include multiple kinds of memory in various embodiments including dynamic random-access memory (DRAM), static random-access memory (SRAM), and/or non-volatile memory (NVM), according to system needs. In addition, while the data processing circuitry can access memory 120, in embodiments, other system components, such as LO control block 121 can also access memory 120, or portions thereof. In embodiments, at least some functionality of LO control block 121 are implemented by software/firmware running on a processor in data processing circuitry 119. FIG. 1 also shows a transmit path 123 that utilizes the same antenna and local oscillator as the receive path. The transmit data may be sent from the memory 120. Details of the transmit path are well known in the art and not further described herein.

BLE requires switching from 2402 MHz to 2480 MHz to transition between the highest and lowest advertising channel. Such a frequency change of 78 MHz is too high a frequency change for a typical VCO to accommodate fast switching as the time needed for frequency calibration for switching to a new frequency (20-40 µs) and synthesizer settling (30 µs) cannot be avoided. In future radios, a few BLE DATA channels can be selected for Wake-up Radio functionality, so it would be preferable to access any BLE channel as well. In addition, preferably embodiments maintain good blocking performance for gateway parts with less than a 3 dB hit in blocking/sensitivity and an allowable increase in current consumption. A gateway part includes WiFi and BLE to link IoT devices to the Internet. Usually, the 2.4 GHz WiFi is seen as a 2.4 GHz interferer that would require improved blocking performance for WiFi co-existence. A desirable target is 10 µs or less to switch for dual-Zigbee receive channels along with BLE ADV channel coverage (i.e., can switch to any channel between 2402 MHz and 2480 MHz). Note that Zigbee has a preamble time of 128 µs and BLE has a preamble time of 8 µs.

In existing approaches phase-locked loops utilized for the frequency synthesizer employ a locking sequence that includes a frequency calibration (FCAL) step for the digital capacitors in a voltage-controlled oscillator (VCO) or a digitally controlled oscillator (DCO). The frequency calibration utilizes in the range of 20-40 μs when switching to a new local oscillator frequency. FCAL itself utilizes capacitors controlled, e.g., by an 11-bit control word, and entails adjusting the capacitors and reading out a frequency of the oscillator output using an RF counter that counts the oscillator output frequency, or a divided down version thereof, over a known time. The capacitance is adjusted until the adjustment results in the desired frequency. The RF counter utilizes a crystal oscillator output as the base clock frequency. Thus, the locking sequence includes adjusting the capacitance of the VCO, comparing the frequency of the VCO output signal to the target frequency, and continuing to adjust the capacitance until the VCO is locked to the target frequency. That process can include, e.g., 11 steps with 1-2 μs per step. The locking sequence further includes a required settling time. Settling time is the time it takes for the frequency synthesizer to provide a stable, locked tone, to the accuracy requirement needed (e.g., 20 ppm). FCAL and sequencing in the PLL ensures the bias states of the PLL are close to a locked condition upon which the PLL settles to the frequency of interest. The initial conditions ensure minimal time is spent in non-linear transients and/or cycle slips. Receivers typically employ a narrow bandwidth PLL in the frequency synthesizer for lower current, improved blocking performance, but with a slow settling time. The settling time for such a receiver is in the range, e.g., of 30 μs. Note that a faster FCAL can occur when the target local oscillator frequency is within, e.g., 2 MHz of the original frequency, e.g., from 2402 MHz to 2404 MHz. That is because the number of required steps can be less since the high order bits of the digital control signal (e.g., 11 bits) do not change for a small frequency change.

To achieve faster switching, the FCAL process and the settling time need to be significantly improved. For example, in one embodiment to achieve switching to a new local oscillator frequency within, e.g., 10 μs, oscillator capacitor banks are loaded based on both current temperature and the magnitude of the local oscillator frequency change, a priori. A priori refers to the initial conditions before beginning the synthesizer attempt to lock to the new frequency. In an embodiment, loading the capacitor banks of the oscillator based on temperature and frequency change takes up 5 μs or less. In addition, in order to achieve a faster settling time, the PLL is set to a higher bandwidth to achieve faster settling. An embodiment achieves 7τ linear settling with 1 MHz bandwidth in 1.14 μs, where τ is the time constant.

Figure 2:
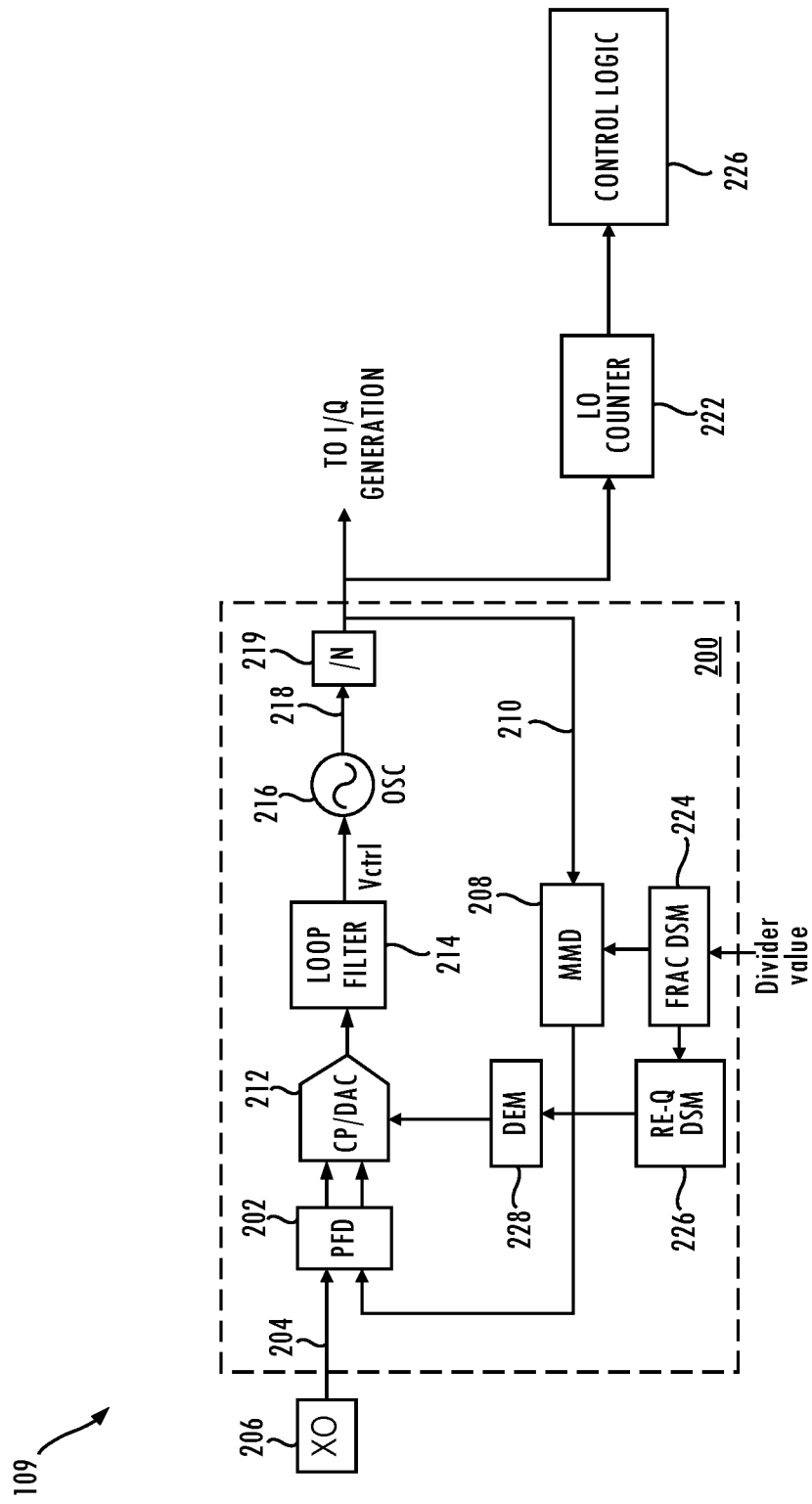
FIG. 2 illustrates a high-level block diagram of an embodiment of a fast-switching synthesizer that achieves faster switching between frequencies than conventional approaches.

FIG. 2 illustrates a high-level block diagram of an embodiment of a fast-switching synthesizer 109 that achieves faster frequency switching than conventional approaches. The synthesizer includes a PLL 200. The phase and frequency detector (PFD) 202 receives a reference clock signal 204 from a crystal oscillator (XO) 206 and a feedback signal from the multi-modulus divider (MMD) 208. The MMD 208 receives a feedback signal 210 that in the illustrated embodiment is based on a divided down oscillator clock signal. The PFD 202 supplies the charge pump and digital-to-analog converter (CP/DAC) 212 with the phase difference between the reference clock signal and the divided down feedback signal from MMD 208. The CP/DAC 212 supplies the loop filter 214, which in turn controls the oscillator 216, which in one or more embodiments is a voltage-controlled oscillator (VCO). The output signal 218 of the oscillator is divided by N, where N is, e.g., an integer, and supplied to the I/Q generation block for use by TX/RX mixers (see FIG. 1). In this embodiment, N is 2 and of course, other divide factors are possible. A local oscillator (LO) counter 222 is used as part of the control logic to determine if the PLL is locked to the desired oscillator frequency corresponding to the desired local oscillator frequency. In the illustrated embodiment, the oscillator output signal is twice the frequency of the desired LO frequency. The MMD 208 is controlled by the delta-sigma modulator (DSM) 224. In an analog PLL-based implementation for quantization noise cancellation (QNC) to achieve wide-band frequency synthesis, the DSM residue is re-quantized by DSM 226, supplied to dynamic element matching (DEM) block 228, and used for QNC in the CP/DAC 212. Other QNC approaches are possible. For example, one or more embodiments employing a digital PLL use a digital-to-time converter (DTC) based implementation of QNC. The PFD-CP in the analog PLL is replaced by a time-to-digital converter (TDC) with a digital filter receiving the digital output of the TDC and the digital filter output controls a digitally controlled oscillator (DCO).

Figure 3:
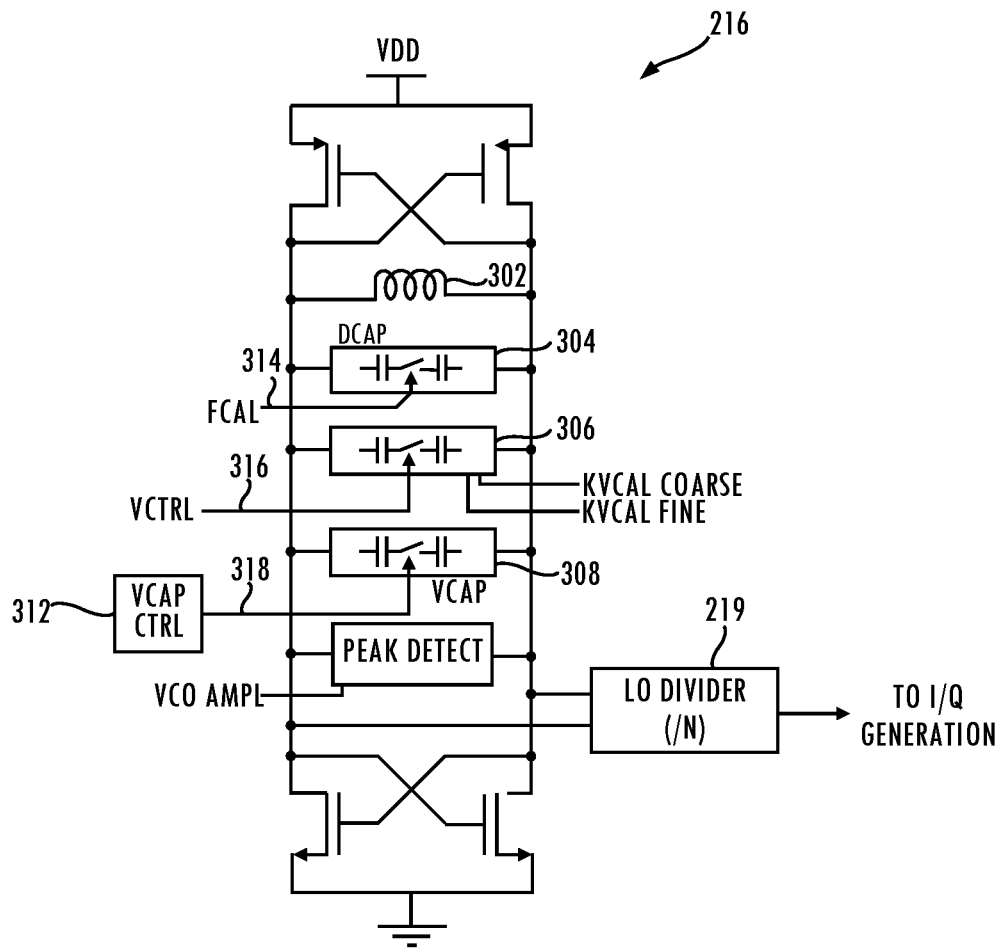
FIG. 3 illustrates an embodiment of a controllable oscillator such as a voltage-controlled oscillator (VCO) for use in faster frequency switching.

FIG. 3 illustrates an embodiment of the controllable oscillator 216 in additional detail. In the embodiment shown in FIG. 3, oscillator 216 is an LC oscillator and includes inductor 302 and three banks of capacitors—capacitor circuits 304, 306, and 308. The capacitor circuit (DCAP) 304 is a digital capacitor array controlled by the calibration signal FCAL 314 and is used to provide a BASE setting for frequency hops by the synthesizer to a new frequency as explained further herein. In an embodiment, the capacitor circuit 306 is an analog capacitor array controlled by the VCTRL signal 316 supplied from the loop filter. In an embodiment in which the oscillator is a DCO, the capacitor array 306 is a digitally controlled capacitor array coupled to digital signals from a digital loop filter. In one or more embodiments in which the oscillator 216 is a VCO, the analog capacitor circuit 306 also provides Kv tuning to tune the gain through the signals $KV_{CAL\_COARSE}$ and $KV_{CAL\_FINE}$. The third capacitor circuit 308 (VCAP) is a variable capacitor circuit controlled by the VCAP control block 312. The VCAP capacitor circuit 308 provides both temperature compensation (TCOMP) and local oscillator compensation (LOCOMP) for frequency changes. Note that while the control signals 314, 316, and 318 are shown as single lines, the control signals can be implemented as multiple signal lines, e.g., when the control signals provide digital control signals to digital capacitor arrays. In other embodiments, one can interpose an analog-to-digital converter and use a PFD/CP/LF with an ADC coupled to a DCO or use a digital-to-analog converter (DAC) and use a DTC with digital filter with a DAC coupled to an L-C VCO. The output of the oscillator 216 is provided to the divider 219 also shown in FIG. 2.

Figure 4:
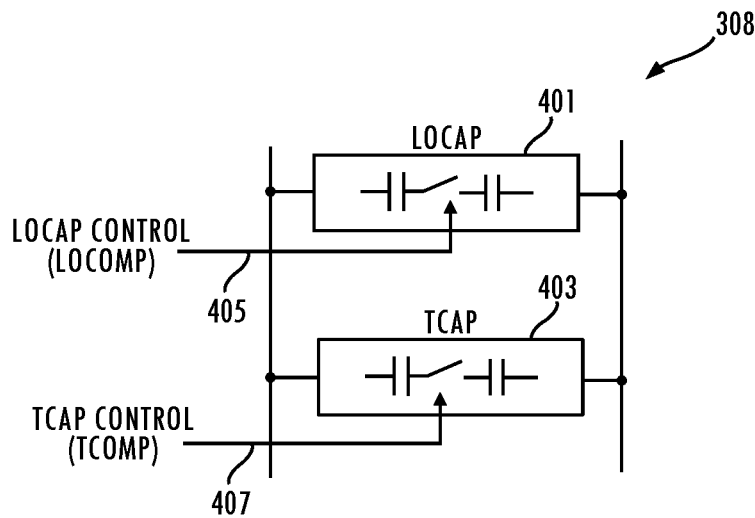
FIG. 4 illustrates an embodiment in which the variable capacitor array (VCAP) is formed by separate local oscillator capacitor (LOCAP) and temperature capacitor (TCAP) capacitor arrays.

Referring to FIG. 4, in some embodiments the VCAP capacitor circuit 308 is implemented as separate capacitor arrays, a local oscillator capacitor (LOCAP) array 401 and a temperature capacitor (TCAP) array 403, which are controlled respectively by control signals 407 for TCOMP and 405 for LOCOMP. In other embodiments, the VCAP circuit 308 is a unitary capacitor array controlled by combining LOCOMP compensation values and TCOMP compensation values and using the net compensation value to control the VCAP array 308. In an embodiment the VCAP array(s) are thermometer encoded linear capacitor arrays that are designed for the temperature and LO compensation range requirements using N1 and N2 control bits, where N1 and N2 are integers. Note that while the control signals 405 are shown as single lines, the control signals are typically implemented as multiple signal lines to provide digital control signals to the capacitor arrays 401 and 403. Thus, when the term control signal is used herein, the term encompasses a control signal with multiple signal lines to provide the control function.

An example of tuning the VCAP array for temperature compensation assumes that the capacitance change responsive to a change of the LSB of the VCAP control signal is:

$$\Delta C = V_{vcap,lsb} = 0.75 \text{ fF}$$

In an embodiment the DCAP array is 300 fF and the VCAP array is 32*0.75 fF=24 fF. Thus, the VCAP array is small compared to the DCAP array 304. The small size of the VCAP array helps ensure the VCAP array is linear, which makes temperature (and local oscillator frequency change) compensation more accurate. The expected change in VCO frequency is:

$$\Delta f_{vco} = -\frac{1}{2} \frac{\Delta C}{C} \times f_{vco}$$

$$\Delta f_{vco} = -\frac{1}{2} \frac{0.75f}{300f} \times 4880 \text{ MHz} = -6.1 \text{ MHz}$$

$$\Delta v_{ctrl} = \frac{-\Delta f_{vco}}{K_{vco}} = -0.2V,$$

assuming $K_{vco}$ is $-30$ MHz/$V$.

However, to remain in a locked condition, the PLL cannot allow for change in VCO frequency and counters the change by decreasing Vctrl, here by −0.2V. Thus, each increment in the VCAP control signal corresponds to −0.2V of the tuning voltage Vctrl. That means that the VCAP array can be used to reduce the need for tuning the VCO through Vctrl. That is, increasing the capacitance of VCAP lowers the VCO frequency and thus the magnitude of any change required to Vctrl to maintain or obtain fast lock. This is accomplished by adjusting VCAP capacitance up to reduce VCO frequency or down to increase VCO frequency.

The following provides an example of how an embodiment of the fast-switching synthesizer is calibrated and used. During product test the fast-switching synthesizer is frequency calibrated to determine a frequency calibration value (FCAL) for one channel at room temperature. That FCAL value is used as a base value point, BASE, to initially set the array DCAP for frequency changes. During the calibration, the VCAP control signals are set to midscale. Thus, assuming that VCAP includes separately controllable arrays, the TCAP control bits N1 are set to mid-scale, and the LOCAP control bits N2 are set to midscale. The frequency of the local oscillator (FLO) is set to a midrange frequency of the channels that are of interest in the particular application. For example, in an embodiment the FLO is chosen to be 2440 MHz, which is close to midrange between 2402 MHz and 2480 MHz for BLE applications. Assuming local oscillator compensation with LOCOMP and TCOMP covers the entire frequency range, a single calibration at room temperature at the chosen frequency is sufficient. In addition, product test determines VCAP gain to calibrate variations over PVT by measuring the frequency difference with two different VCAP control codes. If separate TCAP and LOCAP arrays are used, two separate control codes for each array are used to determine the gain of the TCAP capacitor array and the LOCAP capacitor array. When the frequency synthesizer hops to a new frequency, if the new frequency is sufficiently close to the current frequency, the analog capacitor circuit 306 can accommodate a certain frequency range, e.g., 2 MHz, using the same FCAL value for DCAP 304 and the same TCOMP and LOCAP values for VCAP 308. That is, the PLL can lock to the new frequency using the analog capacitor circuit 306 without any changes to the VCAP array if within the tuning range.

In an embodiment, the Vctrl range is 0.55-1.15V. The calibration operation can ensure avoidance of an FCAL 1-LSB error and ensure Vctrl is approximately 0.85V, which is the center of the Vctrl range. Note that for short bursts in receive mode the Vctrl range of 0.55-1.15V does not need to accommodate margins for modulation, temperature drift, or pulling when the power amplifier is ON, as such are not applicable.

For ease of discussion, assume that temperature compensation (TCOMP) occurs independently of LOCOMP. The calibration code for DCAP determined during product test will not hold over the entire operating temperature range from −40° C. to 125° C. During operation, the temperature measurement used by TCOMP may be measured periodically, e.g., every minute, hour, or provided every time a temperature excursion of more than a predetermined number of degrees occurs. For example, a temperature change of 32° C. may be used in embodiments. Of course, other temperature changes, larger or smaller may be used. In an embodiment, the temperature coefficient is −50 ppm/° C. but other embodiments will have different temperature coefficients based on the design of the VCO. The VCAP array, or the portion used for TCOMP, compensates for temperature, a priori, and ensures compensation for temperature over the entire temperature range.

Similarly, assume that local oscillator compensation LOCOMP (compensation based on the difference between the predetermined calibrated midrange frequency (e.g., for a FLO of 2440 MHz) and the target frequency of the local oscillator) separately controls a portion of capacitor array 308. The product test calibration code for DCAP for a local oscillator frequency of 2440 MHz will not hold over the entire frequency range from 2405-2480 MHz (or 2402-2480 MHz for BLE). Accordingly, LOCAP compensates for FLO variation, a priori. LOCAP compensation can be designed to ensure sufficient range to compensate for the whole 2.4 GHz band used in Zigbee and BLE.

Figure 5:
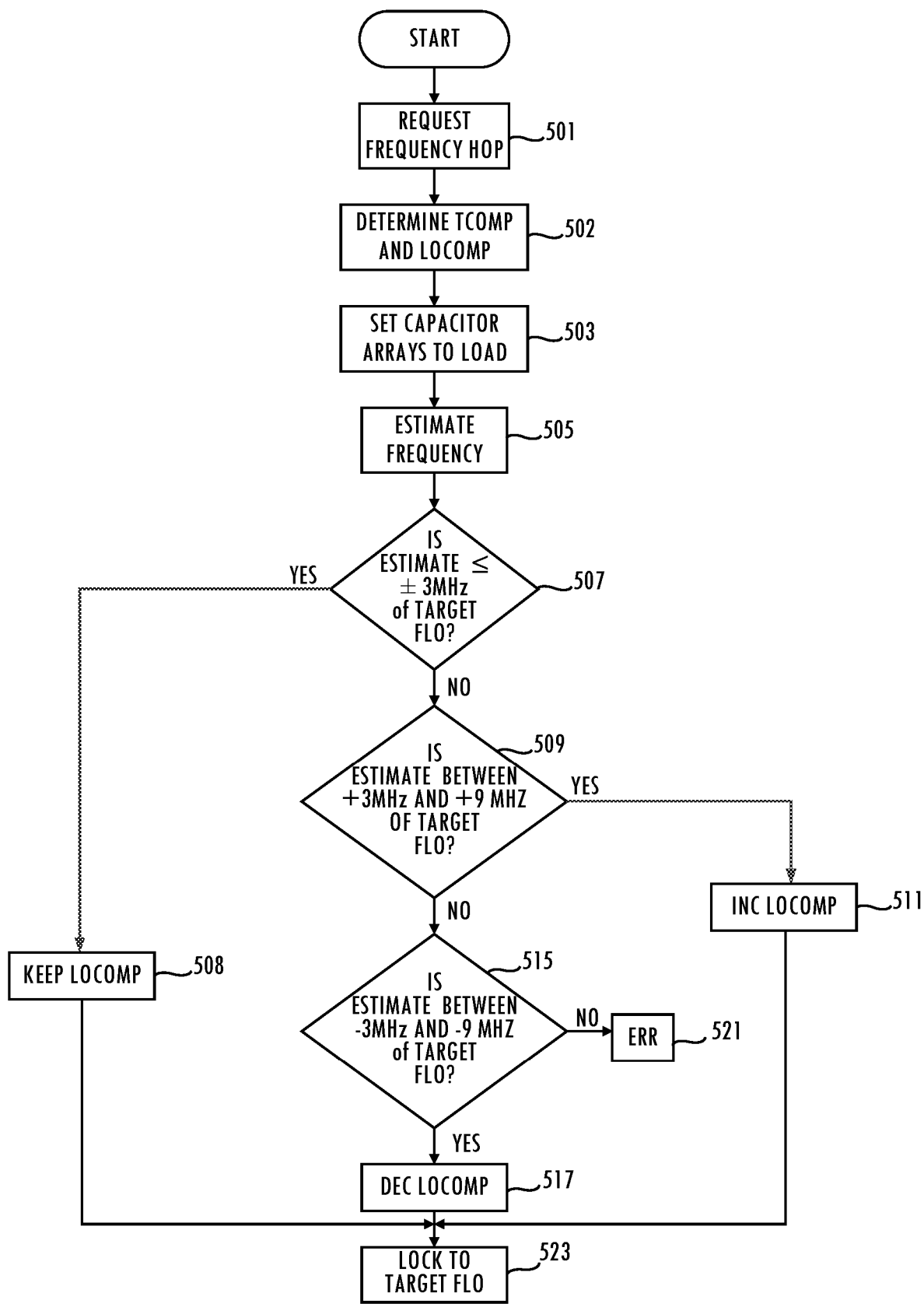
FIG. 5 illustrates a flow diagram for switching frequencies in an illustrative embodiment.

FIG. 5 provides a flow diagram demonstrating switching frequencies for an illustrative embodiment. In 501, the control logic 312 responds to a request to change local oscillator frequency. The request may result from the need to switch from one BLE advertising channel to another BLE advertising channel and/or to or from a Zigbee channel as the receiver looks for incoming traffic or to an initial frequency from a low power or startup state. Note that the fast-switching approach described herein allows switching from any channel to another channel and is not limited to Zigbee RX and BLE ADV channels or even to 2.4 GHz. For example, the fast-switching approach described herein can also be employed in sub-GHz radios and in dual-band 2.4 GHz and Sub-GHz radios. Also, in future radios, customer can select a few BLE DATA channels for Wake-up radio functionality, so it would be preferable to access any BLE channel.

In 502, control logic determines the TCOMP based on the current (most recent) temperature and determines LOCOMP based on the frequency difference between the predetermined midrange FLO for which Vctrl was calibrated at 0.85V and the target FLO. The TCOMP and LOCOMP values may be loaded from lookup tables or calculated by the control logic. The control logic may include state machines and other digital logic, a programmable microcontroller, and any appropriate combination of hardware and software to implement the described functionality. In 503 the control logic loads capacitor arrays 304 and 308 with LOAD=BASE+TCOMP+LOCOMP. BASE is the FCAL value determined during product test, e.g., at a VCO frequency corresponding to a FLO of 2440 MHz. Note that here, TCOMP and LOCOMP are offset values from midscale.

In an embodiment, the control logic checks to see if the capacitor arrays loaded with the LOAD values makes the target frequency within locking range of the PLL and therefore the PLL will be able to lock to the target FLO. After loading the capacitor arrays 304 and 308, the control logic uses an RF counter (see LO counter 222 in FIG. 2) to estimate the VCO frequency in 505 by counting the number of clocks over a particular time period. In an embodiment the RF counter counts FVCO/N (e.g. N is an integer and equals 2) edges over a known time window (with the base time window being set by the XO frequency). In an embodiment, given the desire to keep the frequency hopping time as short as possible, the RF counter provides a frequency estimate in 1 μs with Vctrl=0.85V. The control logic converts that count value to a frequency value based on the frequency of the counter clock. During the frequency estimate, the PLL is in an open loop configuration.

In 507, the control logic checks to see if the frequency estimate is within a desired range, e.g., a range of ±3 MHz of desired FLO. The range is based on the available tuning range for a particular embodiment. If the frequency estimate is within the tuning range, the control logic maintains the value of LOCOMP in 508. In an embodiment in which the local oscillator frequency is one half of the VCO frequency, and assuming an embodiment having a Vctrl range of ±0.2V and assuming Kvco of 30 MHz/V, a ±6 MHz VCO frequency corresponds to ±3 MHz of FLO in the 2.4 GHz frequency spectrum used by Zigbee and BLE. If the frequency estimate is not within the frequency range of ±3 MHz of the desired local oscillator frequency, the control logic checks in 509 if the frequency estimate is in the frequency range of between +3 MHz and +9 MHz of the desired FLO (faster than the desired FLO). If the frequency estimate is between +3 to +9 MHz of the desired local oscillator frequency, the control logic increments the LOCOMP control value supplied to the VCAP (or LOCAP) capacitor array by 1 in 511 to slow down the VCO and proceeds to lock in 523. Note that 6 MHz steps are being used here for correction based on the "locking" range being 6 MHz (±3 MHz). If the estimate is not between +3 to +9 MHz of the desired FLO, the control logic checks in 515 if the frequency estimate is between −3 to −9 MHz of desired local oscillator frequency (slower than the desired FLO). If so, the control logic decrements the LOCOMP control value by 1 in 517 to increase the VCO frequency and goes on to try and lock to the target frequency in 523. The incrementing or decrementing based on the frequency range attempts to bring the current VCO frequency within a tunable range of the target frequency using Vctrl to tune the VCO. If in 515 the control logic determines the frequency estimate is not within the frequency range −3 to −9 MHz of the target frequency, the control logic determines an error condition exists in 521. The error condition may cause the PLL to perform a frequency calibration for the new frequency or take other appropriate action. For example, time permitting for a fast frequency change, more than one increment or decrement of the LOCAP (VCAP) array can be performed. For example, the control logic checks if the frequency is above +9 MHz above the FLO or below −9 MHz of the FLO and if so, increment/decrement the LOCOMP control bits to slow down or speed up the VCO as appropriate, and then return to 507 and recheck. That additional loop can be run once, multiple times, or not at all depending on the particular embodiment. In 523, the PLL is again configured to be closed loop and the control logic tunes Vctrl to lock to the VCO frequency that corresponds to the target local oscillator frequency. The lock occurs by comparing the VCO output frequency to the target frequency and adjusting Vctrl until the PLL has locked.

Note that it is possible to increase Kvco of the VCO and compensate with the charge pump current (Icp) to maintain bandwidth to thereby have a higher effective voltage control range and corresponding higher error margins. For the receive mode, a higher Kvco variation across the control voltage range can be tolerated, which allows for higher error margins with TCOMP and LOCOMP.

Figure 6:
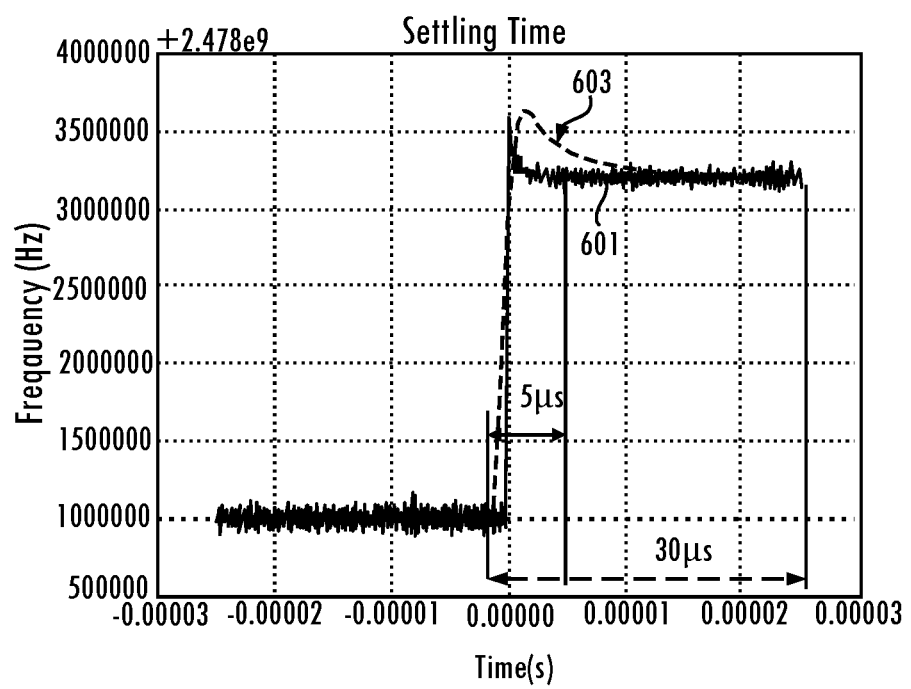
FIG. 6 illustrates graphically the benefits of using a higher bandwidth PLL to achieve faster settling.

In addition to the use of a calibrated FCAL value and TCOMP and LOCOMP when switching frequencies, embodiments use a fast-settling mode in the synthesizer to lower the settling time from 30 μs to <5 μs (with 20 ppm accuracy). The fast-settling mode utilizes a higher bandwidth PLL. The use of the higher bandwidth trades off higher current consumption and blocking degradation due to higher phase noise for a significant enhancement in settling time. Once locking is complete, the control logic reduces the bandwidth (gear shift) to recover blocking and lower current cost. FIG. 6 illustrates graphically the benefits of using a higher bandwidth PLL to achieve a faster settling. Assuming a frequency change of approximately 2.25 MHz from 2.479 GHz to 2.48125 GHz, the settling time shown at 601 for a 2.5 MHz bandwidth PLL is approximately 5 μs while the settling time at 603 for a 250 kHz bandwidth is approximately 30 μs. Once locked, the PLL can shift from the higher bandwidth to the lower bandwidth to both save power and improve blocking. In an embodiment, the lower PLL bandwidth is achieved by reducing the current in the charge pump associated with the charge pump control signals. Thus, e.g., the current associated with the LSB of the charge pump control signal can be reduced by half. In digital PLL implementations, a similar gear-shift in the bandwidth can be achieved using the programmable digital filters.

The following provides an example of temperature compensation being performed by employing TCAP. Assume the temperature control value LSB changes every 32° C.

$$\Delta T_{lsb} = 32° \text{ C.}$$

$$\Delta f_{vco,\Delta T_{lsb}} = TC_{vco} \times \Delta T_{lsb} \times f_{vco}$$

The VCO has a temperature coefficient ($TC_{vco}$) and absent PLL intervention a temperature change would cause a frequency change. However, to remain in a locked condition, the PLL has to counter any temperature change with a change in Vctrl. This could however lead to having the PLL be outside the tuning voltage range depending on the temperature change and hence lose lock. By extending this principle for the PLL to achieve a fast locked state, one needs to guarantee that the PLL would be in its tuning voltage range to get to lock during the load of the base tuning parameters.

$$\Delta v_{ctrl,\Delta T_{lsb}} = -\Delta f_{vco,\Delta T_{lsb}} / K_{vco}$$

TCAP can be employed to compensate for the PLL effect with temperature compensation. With TCOMP, the PLL is guaranteed to be in its tuning voltage range and not lose the locked condition if gracefully employed with a slow ramp. Similarly, by employing TCOMP a priori, the PLL can achieve a fast lock by guaranteeing the PLL to be in its tuning voltage range at the target temperature.

$$\Delta v_{ctrl,TCOMP} = -\Delta v_{ctrl,\Delta T_{lsb}}$$

$$N_{TCAP} = \frac{\Delta v_{ctrl,TCOMP}}{\Delta v_{ctrl,TCAP-LSB}}$$

Assume the VCO temperature coefficient $TC_{vco}=-50$ ppm/° C., and an embodiment supports a temperature range from −40° C. to 125° C. The change in VCO frequency due to temperature is:

$$\Delta f_{vco,\Delta T} = TC_{vco} \times \Delta T \times f_{vco}$$

and $$\Delta v_{ctrl,\Delta T} = \frac{-\Delta f_{vco,\Delta T}}{K_{vco}}$$

The change in Vctrl based on the LSB of the TCOMP control code is:

$$\Delta v_{ctrl,TCAP-LSB} = \frac{\Delta v_{ctrl}}{2^{N1}},$$

where N1 is the number of bits in the TCAP (or VCAP) control word, e.g., 5. To put some concrete numbers to provide a clearer example of temperature compensation, assume $f_{vco}$=4880 MHz, which is twice the LO midrange frequency.

Then, $$\Delta f_{vco,\Delta T_{lsb}} = -50 \text{ ppm/° C.} \times \frac{1}{1M} \times 32° \text{ C.} \times 4880 \text{ MHz} = -7.8 \text{ MHz},$$

$$\Delta v_{ctrl,\Delta T_{lsb}} = -(-7.8 \text{ MHz})/(-30 \text{ MHz}/V) = -0.26V,$$

and $$\Delta v_{ctrl,TCAP-LSB} = -200 \text{ mV},$$

(assuming each TCAP unit increase affects Vctrl by − 200 mV), $$N_{TCAP} = \frac{-(-0.26)}{-0.2} \sim -1$$

$$\Delta v_{ctrl,TCAP} = N_{TCAP} \cdot \Delta v_{ctrl,TCAP-LSB}$$

$N_{TCAP}$ is the code-offset from mid-scale. In this example, $N_{TCAP}$ changes from 16 to 15 to compensate for a 32° C. increase in temperature. Thus, the TCAP control signal should be decremented by one for each 32° C. increase in temperature and incremented by one for each 32° C. decrease in temperature. Decrementing the TCAP control signal decreases the capacitance and increases VCO frequency and vice versa since the VCO frequency is proportional to $1/\sqrt{LC}$. A lower temperature increases the VCO frequency since the temperature coefficient is negative and a higher temperature decreases the VCO frequency.

The control voltage after a temperature change of ΔT can be given as $$v_{ctrl,to}=v_{ctrl,from}+\Delta v_{ctrl,\Delta T}+\Delta v_{ctrl,TCAP}$$

and due to the finite resolution of the TCAP array, the Vctrl residue is given by $$v_{ctrl,res}=v_{ctrl,to}-v_{ctrl,from}$$

which can be corrected by the PLL provided it is within the tuning voltage range.

The table shown in FIG. 7 shows why the calibration code does not hold over the entire temperature range from −40° C. to 125° C. FIG. 7 shows the temperature change in the left most column. The next column (FVCO) shows the frequency caused by the temperature change (assuming Vctrl is kept the same). The DCAP column shows the code for the DCAP array (array 304 in FIG. 3) is set to the BASE value with the BASE value being determined at product test to cause the VCO to produce a signal of 4880 MHz with Vctrl at 0.85V and the VCAP values for TCOMP and LOCOMP at midrange. Note that the value of Vctrl to achieve 4880 MHz at 25° C. determined at product test will be approximately 0.85V, which is midrange of the tuning voltage of 0.55V to 1.15V. The deltaF column shows the change in frequency due to the temperature change absent any change in Vctrl and assuming the temperature coefficient is −50 ppm/° C. The Kvco column assumes the VCO gain is stable at −30 MHz/V. The DeltaV Temp column shows the needed change in Vctrl voltage to keep the VCO constant at 4880 MHz. The TCAP code for TCOMP is set at midrange of 16, assuming a 5-bit TCAP (or VCAP) control signal for TCOMP. The range in voltage due to TCAP change (DeltaV TCAP) is 0 with the TCAP code at 16. The Vctrl column shows the control voltage needed to maintain a stable frequency of 4880 MHz. The TCOMP offset column shows the change to the VCAP code is zero since the VCAP code remains at 16.

Still referring to FIG. 7, if the temperature decreases by 32° C. to −7° C., the VCO control voltage Vctrl needs to increase from 0.85V to 1.11 V to bring the oscillator frequency back down to 4880 MHz. That is close to the edge of the tuning range of the VCO of 1.15V. Similarly, if the temperature increases by 32° C. to 57° C., the VCO control voltage Vctrl needs to move from 0.85V by 0.26V to 0.59 V to keep the oscillator frequency at 4880 MHz, which is close to the edge of the tuning range of 0.55V. However, additional temperature change requires a change to Vctrl that is outside the tuning range of the VCO. For example, a temperature of 89° C. requires a change in Vctrl of $$-0.52V\left(\left(\frac{\Delta f}{K_{Vco}}\right)\right)$$

or (15.6 MHz/−30 MHz/V)) to pull the VCO frequency back to the higher frequency of 4880 MHz. That requires Vctrl to be at 0.33V, which is outside the tuning range of the VCO. Thus, the BASE DCAP code does not hold over the entire temperature range.

FIG. 8 illustrates how TCOMP and the TCAP (or VCAP) array can be used to ensure Vctrl is within tuning range of the VCO over the entire temperature range. The columns in FIG. 7 and FIG. 8 are the same with DeltaV TCAP showing the change in voltage due to the change in the TCAP code. FIG. 8 shows the TCAP code changing as the temperature changes to allow Vctrl to always be within the tuning range. The TCAP code changes by −1 for each +32° C. change in temperature and by +1 for each −32° C. change. When the temperature decreases by 32° C. to −7° C. the VCAP code increases from 16 to 17. That means the TCAP array contributes an additional −0.21V to the oscillator control voltage. In other words, the increased capacitance of the TCAP (VCAP) array, which slows the VCO, reduces the magnitude of the needed Vctrl change by −0.21V. That assumes an approximately −210 mV change for each unit increment of the TCAP code (+210 mV for each unit decrement). Since the oscillator control voltage needs to change by 0.26V to maintain the frequency (see DeltaV Temp column), the contribution from the TCAP array reduces the need for Vctrl to change to 0.05V (0.26V−0.21V). The PLL compensates for the finite resolution of the LSB of the TCAP array by adjusting the Vctrl voltage by 0.05V. Thus, Vctrl only changes from 0.85 to 0.90 to properly tune with the measured temperature. That is well within the tuning range of the PLL.

If the temperature increases by 32° C. to 57° C., the VCO control voltage Vctrl needs to move by −0.05V to 0.80V to keep the oscillator frequency at 4880 MHz, assuming a change in the VCAP code from 16 to 15. TCAP contributes +0.21V to the total required change of −0.26V.

With a temperature of 89° C., the TCAP code changes to 14 resulting in a +0.42V contribution to the required total VCO control voltage change of −0.52V resulting in a Vctrl of 0.75V to maintain the VCO frequency at 4880 MHz. In other words, the decreased capacitance of the TCAP (or VCAP) array, which increases the frequency of the VCO, reduces the magnitude of the needed Vctrl change by +0.42V. Thus, instead of being outside the tuning range for Vctrl as shown in FIG. 7, the Vctrl value of 0.75V is well within the tuning range of the VCO. Note that the values shown in FIGS. 7 and 8 are examples and each design will have different Vctrl values, and TCAP values depending on such factors as the temperature coefficient, the contribution from each TCAP unit, the tuning range of the VCO, Kvco, and the supported temperature range.

Figure 9:
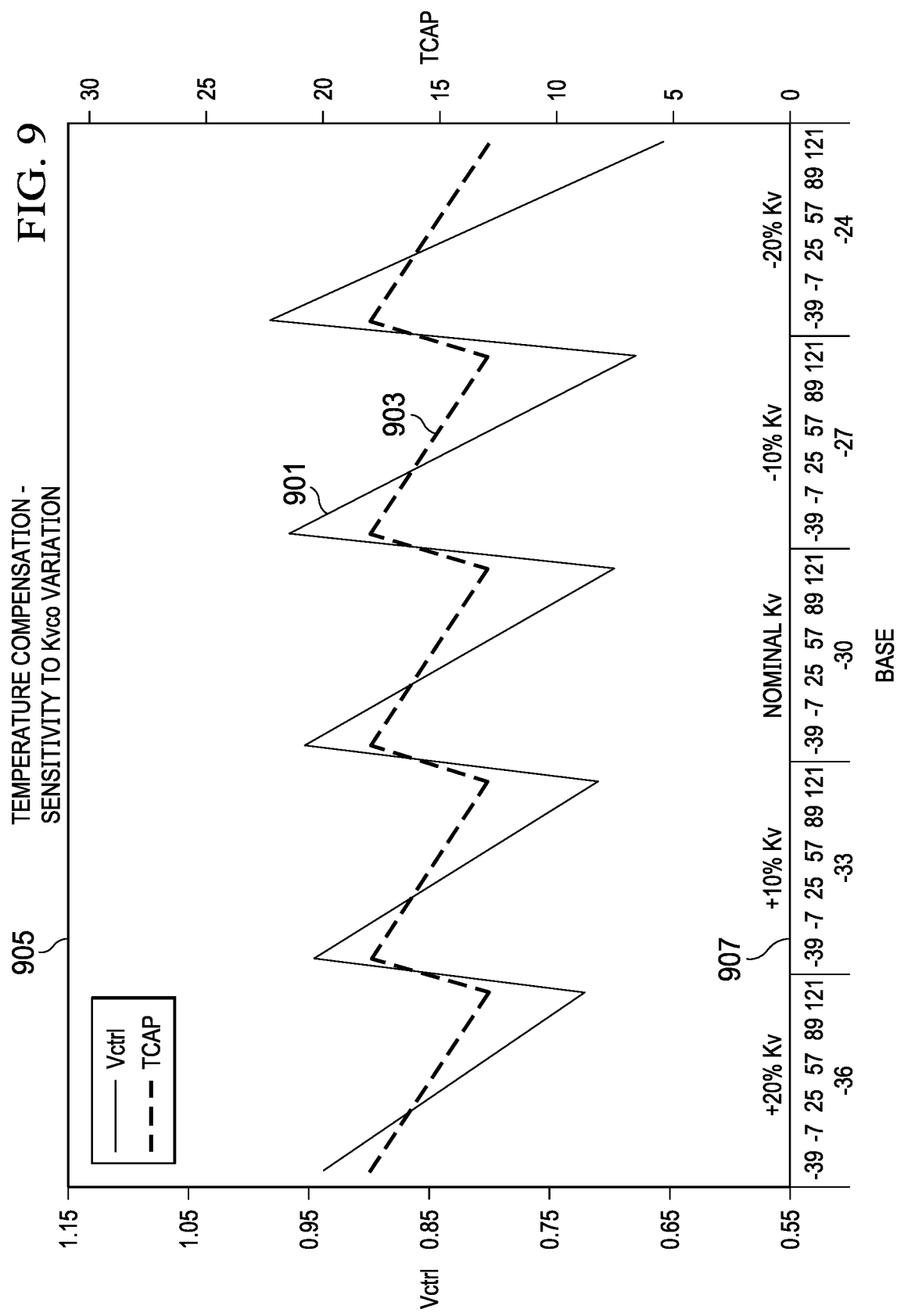
FIG. 9 illustrates that the use of the TCAP array keeps Vctrl within the VCO tuning range with variations in the VCO gain Kvco.

FIG. 9 illustrates graphically how the use of TCAP (or VCAP) keeps Vctrl well within the tuning range of 0.55V to 1.15V even with variations in the VCO gain Kvco. The illustrated simulation assumes a BASE value at 2440 MHz and TCOMP is used to adjust TCAP according to temperature. The X axis shows bins of Kvco variations including +20%, +10%, nominal, −10%, and −20%. Vctrl is shown as line 901 and the TCAP control code is shown as line 903. The tunable voltage range is also shown with lines 905 and 907 at 1.15V and at 0.55V, respectively. FIG. 9 shows that even with variations in VCO gain, the use of the TCAP array for temperature compensation provides approximately 100 mV of margin between the highest Vctrl setting of almost 1.05V when Kvco was −24 MHz/V and even more margin to the 0.55V tuning limit for Vctrl. FIG. 9 shows the TCAP control code on the right of the graph and Vctrl on the left.

The principles of local oscillator compensation (LO-COMP) for various embodiments described herein are explained using the following. In an embodiment the change in frequency supported by LOCOMP is the maximum change in frequency, $$\Delta f_{vco} = f_{max,vco} - f_{min,vco}.$$

The change in Vctrl depends on the change in frequency and Kvco:

$$\Delta v_{ctrl} = \Delta f_{vco}/K_{vco}$$

The value of the LSB for LOCAP control is determined as:

$$\Delta v_{ctrl,LOCAP-lsb} = \frac{\Delta v_{ctrl}}{2^{N2}}$$

The change in frequency required due to the frequency hop is:

$$\Delta f_{vco,hop} = f_{vco,to} - f_{vco,from}$$

The change in Vctrl depends on the change in frequency and the gain:

$$\Delta v_{ctrl,hop} = \Delta f_{vco,hop}/K_{vco}$$

Due to the frequency hop, the PLL responds with a change in control voltage for the change in VCO frequency. This could however lead to having the PLL be outside the tuning voltage range depending on the frequency change and hence lose lock. By extending this principle for the PLL to achieve a fast locked state, one needs to guarantee that the PLL would be in its tuning voltage range to get to lock during the load of the base tuning parameters.

$$\Delta v_{ctrl,LOCOMP} = -\Delta v_{ctrl,hop}$$

$$N_{LOCAP} = \frac{\Delta v_{ctrl,LOCOMP}}{\Delta v_{ctrl,LOCAP-LSB}}$$

$$\Delta v_{ctrl,LOCAP} = N_{LOCAP} \cdot \Delta v_{ctrl,LOCAP-LSB}$$

The following provides an example of operation of LOCOMP for a specific frequency hop from 2440 MHz to 2402 MHz:

$$\Delta f_{vco,hop} = 2\times(2402-2440) \text{ MHz} = -76 \text{ MHz},$$

$$\Delta v_{ctrl,hop} = -76 \text{ MHz}/(-30 \text{ MHz}/V) = +2.53V$$

$$\Delta v_{ctrl,LOCAP-LSB} = -200 \text{ mV}$$

$$N_{LOCAP} = -(+2.53)/(-0.2) \approx +12,$$

which indicates that the LOCAP (or VCAP) code should increase by 12 to reflect an increase in capacitance to slow down to a FLO of 2402 MHz.

Thus, a frequency hop from 2440 MHz to 2402 MHz requires an increase in the LOCAP control signal from 16 to 28. The total range would be in the range of +2.53V to −2.67V and ±12 code offsets for change from 2402 to 2480 MHz.

The control voltage after a frequency hop of $\Delta f_{vco,hop} = f_{vco,to} - f_{vco,from}$ can be given as $$v_{ctrl,to} = v_{ctrl,from} + \Delta v_{ctrl,hop} + \Delta v_{ctrl,LOCAP}$$

Due to the finite resolution of the LOCAP array, the Vctrl residue is given by $$v_{ctrl,res} = v_{ctrl,to} + v_{ctrl,from},$$

which can be corrected by the PLL provided it is within the tuning voltage range.

FIG. 10 illustrates why local oscillator compensation is required to maintain Vctrl within its tuning range limits for the Zigbee protocol when the local oscillator hops from one frequency to another Zigbee frequency. FIG. 10 shows Vctrl versus local oscillator frequency (FLO) and assumes the DCAP code (BASE) is set for a FLO of 2440 MHz and Vctrl is set at 0.85V (middle of the tuning range). FIG. 10 shows the local oscillator frequency (FLO) in the left most column. The next column shows the protocol. The Channel column indicates the kind of transmissions that occur, here the channels are Zigbee DATA channels. The Channel Number column indicates the Zigbee channel number. The DCAP code is the BASE code determined during product test. The LOCAP code is set at midrange of 16 and assumes a five-bit LOCAP code. The DeltaFVCO column shows the required change in the VCO frequency for the frequency hop. For an FLO change from 2440 MHz to 2405 MHz, the change in VCO frequency is 2×(2405-2440) MHz, i.e. -70 MHz, with the change in VCO frequency at twice the change in the FLO in this embodiment. The Kvco column shows the gain, which is assumed to be -30 MHz/V. The DeltaV_FLO column shows the change in voltage required to tune the VCO to the target frequency assuming a starting point at 2440 MHz with Vctrl at 0.85V. As can be seen from FIG. 10, a change from Zigbee channel 18 (2440 MHz) to channel 17 requires an increase in voltage of 0.33V from 0.85V to 1.18V, which is outside the tuning range of the VCO and the PLL would lose lock. Similarly, a change to channel 19 would result in a change in voltage of -0.33V from 0.85V to 0.52V, which is also outside the tuning range of Vctrl. Thus, any Zigbee channel change would cause the PLL to lose lock or not be able to attain fast lock. As can be seen from FIG. 10, an FLO of 2405, absent LOCOMP, requires Vctrl to be 3.18V and an FLO of 2480 MHz requires a Vctrl of -1.82. Both the Vctrl values are well outside the tuning range of the VCO.

FIG. 11 illustrates how the use of LOCOMP with the LOCAP capacitor array ensures that Vctrl remains within tuning range for Zigbee channel changes. The columns in FIG. 10 represent the same information as the corresponding columns in FIG. 11. The additional column DeltaV LOCAP shows the additional voltage contribution caused by the change in the LOCAP code, i.e., the reduction in the magnitude of the Vctrl change due to the change in the LOCAP capacitance and the LOCOMP Offset column shows the offset to the LOCAP code. Referring by way of example to a VCO frequency change of -70 MHz corresponding to change from a FLO of 2440 MHz to 2405 MHz, the LOCAP code is 27, offset of +11, which results in a contribution from the LOCAP array of -2.29V. In other words, the increased capacitance of the LOCAP array, which slows the VCO, reduces the magnitude of the needed Vctrl change by -2.29V. Assuming that the DCAP code was set to the BASE value in response to the request to change to the new frequency, the change from 0.85V (the BASE value) to the required new Vctrl value of 0.89V requires only 0.04V increase for the VCO to tune to the new frequency, which is well within the VCO tuning range. To achieve a faster settling time, the PLL with a larger bandwidth is utilized and once locked to the new frequency, the smaller bandwidth is utilized to reduce current consumption and provide improved blocking. A second example goes from 2440 MHz to 2480 MHz. Again, assuming starting with Vctrl at a base value of 0.85V, the total VCO voltage change required is -2.67V. By loading a LOCAP code of 4, an offset of -12, or DeltaV LOCAP of +2.5V, the required Vctrl voltage change is reduced to -0.17V. Thus, Vctrl needs to change only to 0.68V, well within the tuning range. The PLL compensates for the finite resolution of the LSB of the VCAP array by adjusting the Vctrl voltage by -0.17V. Thus, the LOCAP array can contribute from -2.29V to +2.5V to reduce the required changes to Vctrl.

Figure 12:
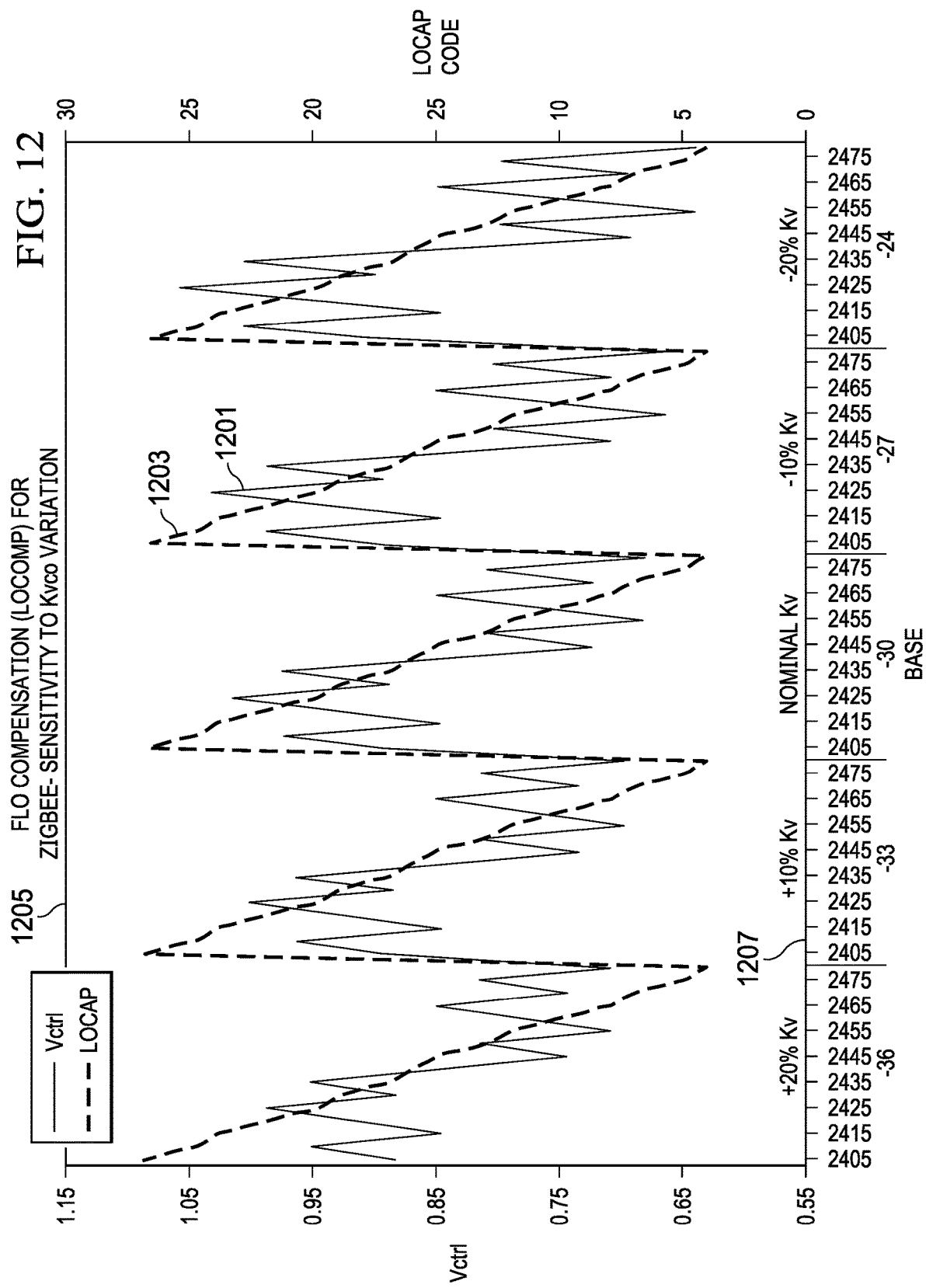
FIG. 12 illustrates how the use of LOCAP keeps Vctrl within the VCO tuning range even with variations in the VCO gain Kvco.

FIG. 12 illustrates graphically how the use of LOCAP (or VCAP) keeps Vctrl well within the VCO tuning range of 0.55V to 1.15V even with variations in the VCO gain Kvco. The illustrated simulation assumes a BASE value at 2440 MHz and LOCOMP is used to adjust LOCAP (or VCAP) according to the frequency change. The X axis shows bins of Kvco variations including +20%, +10%, nominal, -10%, and -20%. Vctrl is shown as line 1201 and LOCAP is shown as line 1203. The tunable voltage range is shown with lines 1205 and 1207 at 1.15V and at 0.55V, respectively. Even with variations in VCO gain, the use of LOCAP to compensate for frequency changes of the local oscillator provides approximately 100 mV of margin between the highest Vctrl setting of approximately 1.05V when Kvco was -24 MHz/V and approximately 100 mV margin to the 0.55V tuning limit for Vctrl in the -24 Kvco gain. FIG. 12 shows the LOCAP control code on the right of the graph and Vctrl on the left.

FIGS. 13A and 13B illustrates why local oscillator compensation is required to maintain Vctrl within its tuning range limits for the BLE protocol when the local oscillator hops from one channel to another channel. FIGS. 13A and 13B shows Vctrl versus local oscillator frequency (FLO) and assumes the DCAP code (BASE) is set for a FLO of 2440 MHz and Vctrl is set at 0.85V (middle of the tuning range). FIGS. 13A and 13B shows the local oscillator frequency (FLO) in the left most column. The next column shows the protocol (here BLE). The Type column indicates whether the channel is an advertising channel (ADV) or a DATA channel. The Channel Number column indicates the BLE channel number. The DCAP code is the BASE code determined during product test. The LOCAP code is set at midrange of 16 and assumes a five-bit LOCAP code. The DeltaFVCO column shows the required change in the VCO frequency for the frequency hop. As shown above, for an FLO change from 2440 MHz to 2402 MHz, the change in VCO frequency is 2×(2402-2440) MHz, i.e., -76 MHz, with the change in VCO frequency at twice the change in the FLO in this embodiment. The Kvco column shows the gain, which is assumed to be -30 MHz/V. The DeltaV_FLO column shows the change in voltage required to tune the VCO to the target frequency assuming a starting point at 2440 MHz with Vctrl at 0.85V. As can be seen from FIGS. 13A and 13B, a change from BLE 2440 MHz to 2402 MHz (ADV1) requires an increase in voltage of 2.53V from 0.85V to 3.38V, which is outside the tuning range of the VCO and the PLL would lose lock or not be able to attain fast lock. Similarly, a change to either 2426 MHz (ADV2) or 2480 (ADV3) from 2440 MHz would cause the VCO to lose lock or not be able to attain fast lock absent LOCOMP. The change from 2440 MHz to 2480 MHz results in a change in Vctrl of -2.67V from 0.85V to -1.82V, which is also outside the tuning range of Vctrl. The change from 2440 MHz to 2436 MHz, 2438 MHz, 2442 MHz, or 2444 MHz is within the tuning range of the VCO.

FIG. 14 illustrates how the use of LOCOMP with the LOCAP capacitor array ensures that Vctrl remains within the tuning range for BLE channel changes. The columns in FIG. 14 represent the same information as the corresponding columns in FIG. 13. The additional column DeltaV LOCAP shows the additional voltage contribution caused by the change in the LOCAP code, i.e., the reduction in the magnitude of the Vctrl change due to the change in the LOCAP capacitance. The LOCAP code shows the LOCAP control code utilized for the frequency change. The LOCOMP Offset column shows the offset to the LOCAP code. Referring by way of example to a VCO frequency change of -76 MHz corresponding to change from an FLO of 2440 MHz to 2402 MHz, the LOCAP code is 28, or an offset of +12, which results in a contribution from the LOCAP array of -2.5V. In other words, the increased capacitance of the LOCAP array, which slows the VCO, reduces the magnitude of the needed Vctrl change by -2.5V. Assume the DCAP code is set to the BASE value in response to the request to change to the new frequency, the change to 2402 MHz requires Vctrl to increase by 2.53V (absent the contribution from LOCOMP). With the contribution of LOCAP of -2.5 V, Vctrl only needs to change by 0.03V to 0.88V, well within the turning range. For a change to 2480

MHz, Vctrl requires a −2.67V change to −1.82V. With LOCOMP, the LOCAP (or VCAP) code is set to 4, or an offset of −12, for a voltage contribution of +2.5V. In other words, the decreased capacitance of the LOCAP array, which speeds up the VCO, reduces the magnitude of the needed Vctrl change by +2.5V. That means that Vctrl only needs to change by −0.17V to 0.68V.

Figure 15:
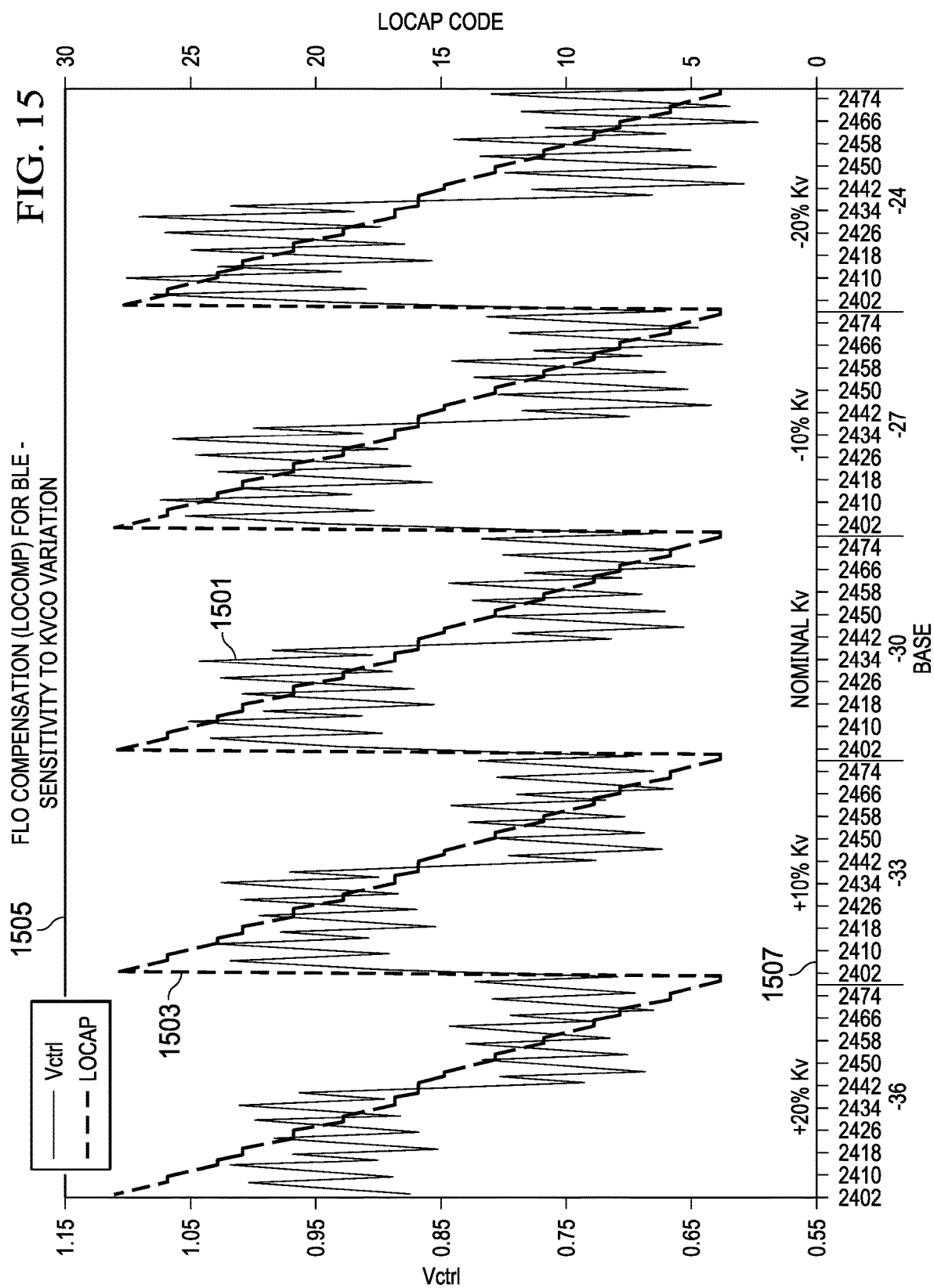
FIG. 15 illustrates how the use of LOCAP capacitor array keeps Vctrl within the VCO tuning range even with variations in the VCO gain Kvco.

FIG. 15 illustrates graphically how the use of LOCAP (or VCAP) keeps Vctrl well within the VCO tuning range of 0.55V to 1.15V even with variations in the VCO gain Kvco. The illustrated simulation assumes a BASE value at 2440 MHz and LOCOMP is used to adjust LOCAP (or VCAP) according to the frequency change. The X axis shows bins of Kvco variations including +20%, +10%, nominal, −10%, and −20%. Vctrl is shown as line 1501 and the LOCAP voltage is shown as line 1503. The tunable voltage range is shown by lines 1505 and 1507 at 1.15V and at 0.55V, respectively. Even with variations in VCO gain, the use of LOCAP (or VCAP) to compensate for frequency changes of the local oscillator provides approximately 70 mV of margin between the highest Vctrl setting of 1.05V when Kvco was −24 MHz/V and approximately 50 mV margin to the 0.55V tuning limit for Vctrl in the −24 Kvco gain. FIG. 15 shows the LOCAP control code on the right of the graph and Vctrl on the left.

Referring back to FIG. 5, when a frequency hop occurs from one BLE frequency to another BLE frequency or from/to a Zigbee frequency, the use of TCOMP and LOCOMP combined ensures that the frequency hops can be tuned by using Vctrl. While the various tables show the frequency hops from one BLE channel to another BLE channel or from one Zigbee channel to another Zigbee channel, the same LOCOMP and TCOMP approach is used for changing from one Zigbee channel to a BLE channel or vice versa. The frequency hop starts by looking up the temperature to find the temperature compensation values and the frequency difference between the FCAL frequency used during calibration, e.g., 2440 MHz and the target BLE or Zigbee frequency. The TCOMP and LOCOMP codes for TCAP and LOCAP respectively, can be provided in lookup tables as shown herein or calculated by the control logic. Those codes are used to set the TCAP and LOCAP capacitor arrays to the proper capacitance and then the flow goes to 505 to estimate the frequency and adjust the LOCAP codes if needed. Note that some embodiments avoid the frequency checks between steps 505 and 521 and go directly to lock in 523 after loading the VCAP.

While the fast frequency switching can be used by the receiver when looking for in bound communications, the fast frequency switching can also be used for changing frequencies between a transmit operation and a receive operation. For example, assume a BLE transmit operation completes on one of the BLE DATA channels, the fast frequency change can be used to switch to a different receive frequency, e.g., a BLE channel or a Zigbee channel.

In addition, while the description above has generally described fast switching using a voltage-controlled oscillator as a controllable oscillator, more generally, the approach can be utilized for a PLL with other types of controllable oscillators, such as a digitally controlled oscillator, which is commonly used in digital PLLs. Thus, in a digitally controlled oscillator, the Vctrl signal 316 supplied from the loop filter 214 (see FIGS. 2 and 3) is a digital signal and the capacitor array 306 is digitally controlled rather than an analog capacitor array. Thus, in an embodiment in which the oscillator 216 is a DCO, Vctrl 316 is set during product test to a digital value to achieve an oscillator output frequency corresponding to a FLO of 2440 MHz at room temperature with the TCAP and LOCAP control codes at midscale. The compensation proceeds as described above for a frequency hop except rather than adjusting Vctrl to the voltage corresponding to the predetermined frequency (FLO at 2440 MHz), the digital control signal for capacitor array 306 is set to the predetermined digital value (for FLO at 2440 MHz) and the TCOMP and LOCOMP compensation is used as described above to ensure the digital PLL can lock to the target frequency using the digital loop filter.

For embodiments utilizing digitally controlled ring oscillator, the oscillator can control frequency using as the frequency control parameter capacitance or can use current starved techniques to modulate resistance to obtain frequency change as a frequency control parameter. The proposed technique to achieve fast frequency synthesis can be generalized to a fast load of the frequency control parameter banks—capacitor for LC based oscillators and capacitor and/or resistance settings for ring oscillators along with use of wide-bandwidth PLL to achieve fast locking times and gear-shifting to narrow-bandwidth to recover phase noise and thereby blocking performance with minimal impact on the locked tone.

Generally, this approach is also useful to achieve fast locking frequency synthesizers, to help set up the receive and transmit chains for actual operations or background calibrations. Thus, the PLL can be set to its initial frequency quickly from a startup or quiescent state where the transmit chain and/or receive chain have been powered down for power conservation purposes during operation. The fast-locking approaches described herein allow the PLL to lock to the initial frequency in less than 10 μs while conventional approaches would take in the 50-60 μs range. Such fast locking helps in scheduling and to lower quiescent current when not in active RX/TX modes.

Note that in addition to the temperature compensation used for switching frequencies, another background temperature compensation loop may be running in the PLL to adjust the VCO based on temperature after the fast settling is completed to compensate for VCO drifts due to change in ambient temperature.

Thus, a fast frequency synthesizer for a receiver (and a transmitter) that can quickly switch between frequencies to better listen for incoming traffic has been described. The description of the invention set forth herein is illustrative and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   receiving a request for an oscillator of a phase-locked loop (PLL) to generate an oscillator output signal having a first frequency;
   setting a first capacitor circuit of the oscillator to a first capacitance corresponding to a predetermined frequency responsive to the request;
   setting a second capacitor circuit of the oscillator to a second capacitance according to a frequency difference between the predetermined frequency and the first frequency and according to a measured temperature; and
   wherein setting the second capacitor circuit to the second capacitance occurs before the PLL attempts to lock to the first frequency.

2. The method as recited in claim 1 further comprising:
setting the first capacitance and the second capacitance such that the first frequency is within a tuning range of the PLL, and locking the PLL to the first frequency by adjusting a third capacitance of a third capacitor circuit of the oscillator responsive to an output from a loop filter of the PLL.

3. The method as recited in claim 1, further comprising:
generating a local oscillator signal based on the oscillator output signal; and
using the local oscillator signal in a receive circuit or a transmit circuit.

4. The method as recited in claim 1, further comprising:
using at least one lookup table to set the second capacitor circuit to the second capacitance according to the frequency difference and according to the measured temperature.

5. The method as recited in claim 1, wherein setting the second capacitance comprises setting a first variable capacitor array of the second capacitor circuit to a first variable capacitor array capacitance, at least in part, according to the frequency difference.

6. The method as recited in claim 5, wherein setting the second capacitance comprises setting a second variable capacitor array of the second capacitor circuit to a second variable capacitor array capacitance according to the measured temperature.

7. The method as recited in claim 5, wherein setting the second capacitance further comprises setting the first variable capacitor array to the first variable capacitor array capacitance, in part, according to the measured temperature.

8. The method as recited 1, further comprising:
determining a frequency estimate of the oscillator output signal with the first capacitance set responsive to the request and the second capacitance set responsive to the request, the frequency estimate being determined prior to the PLL locking to the first frequency;
maintaining a control code associated with the second capacitance responsive to the frequency estimate being within a first frequency range of the first frequency; and
modifying the control code responsive to the frequency estimate not being within the first frequency range.

9. The method as recited in claim 8, wherein modifying the control code further comprises:
determining if the frequency estimate is within a second frequency range higher than the first frequency; and
responsive to the frequency estimate being within the second frequency range, modifying the control code to cause the second capacitor circuit to have a higher capacitance than the second capacitance.

10. The method as recited in claim 9, wherein modifying the control code further comprises:
determining if the frequency estimate is within a third frequency range lower than the first frequency; and
responsive to the frequency estimate being within the third frequency range modifying the control code to cause the second capacitor circuit to have a lower capacitance than the second capacitance.

11. The method as recited in claim 1 further comprising:
locking to the first frequency by adjusting a third capacitance of a third capacitor circuit of the oscillator responsive to an output from a loop filter of the PLL with a bandwidth of the PLL set to a first bandwidth; and
subsequently changing the bandwidth of the PLL to a second bandwidth that is lower than the first bandwidth while the PLL is locked to the first frequency.

12. The method as recited in claim 1 wherein the predetermined frequency is approximately midrange of a plurality of frequencies to be generated by the oscillator.

13. The method as recited in claim 1 wherein the request for the oscillator to generate the oscillator output signal having the first frequency is to change from a second frequency to the first frequency or from a low power state.

14. An apparatus comprising:
a phase-locked loop including an oscillator to generate an oscillator output signal;
control logic to receive a request for the oscillator output signal to be a first frequency;
the oscillator having a first capacitor circuit and a second capacitor circuit, the second capacitor circuit having one or more capacitor arrays;
wherein the control logic is responsive to the request to set the first capacitor circuit to a first capacitance, the first capacitance corresponding to a predetermined frequency; and
wherein the control logic is responsive to the request to set the second capacitor circuit to a second capacitance before the phase-locked loop attempts to lock to the first frequency, the second capacitance being determined according to a frequency difference between the predetermined frequency and the first frequency and according to a measured temperature.

15. The apparatus as recited in claim 14 further comprising:
a third capacitor circuit; and
wherein with the first capacitor circuit set to the first capacitance and the second capacitor circuit set to a second capacitance, the oscillator is within a tuning range of the first frequency using the third capacitor circuit.

16. The apparatus as recited in claim 14 further comprising:
a lookup table storing capacitance values for second capacitor circuit based, at least in part, on the first frequency.

17. The apparatus as recited in claim 14 further comprising:
a first capacitor array forming a first portion of the second capacitor circuit;
a second capacitor array forming a second portion of the second capacitor circuit;
a first capacitor control signal supplied by the control logic to set a first array capacitance of the first capacitor array according to the measured temperature;
a second capacitor control signal supplied by the control logic to set a second array capacitance of the second capacitor array according to the frequency difference; and
wherein the second capacitance is formed by the first array capacitance and the second array capacitance.

18. The apparatus as recited in claim 17 further comprising:
a frequency counter coupled to the oscillator output signal;
the control logic being configured to determine a frequency estimate based on the frequency counter with the first capacitance and the second capacitance being set responsive to the request, the frequency estimate being determined prior to the phase-locked loop locking to the first frequency;
the control logic being further configured to keep unchanged a control code associated with the second capacitance responsive to the frequency estimate being within a first frequency range of the first frequency; and the control logic being further configured to modify the control code responsive to the frequency estimate not being within the first frequency range of the first frequency.

19. The apparatus as recited in claim 18, wherein the control logic is responsive to the frequency estimate being within a second frequency range higher than the first frequency to modify the control code to cause the second capacitor circuit to have a higher capacitance than the second capacitance; and wherein the control logic is responsive to the frequency estimate being within a third frequency range lower than the first frequency to modify the control code to cause the second capacitor circuit to have a lower capacitance than the second capacitance.

20. The apparatus as recited in claim 14 further comprising:

a local oscillator circuit coupled to the oscillator output signal; and a mixer circuit coupled to the local oscillator circuit, the mixer circuit being part of a radio receiver circuit.

21. The apparatus as recited in claim 14 wherein the phase-locked loop locks to the first frequency with a bandwidth of the phase-locked loop set to a first bandwidth and the bandwidth of the phase-locked loop is set to a second bandwidth that is lower than the first bandwidth while the phase-locked loop is locked to the first frequency.

22. An apparatus comprising:

a phase-locked loop including an oscillator;

control logic to receive a request to cause the oscillator to supply an oscillator output signal with a desired frequency;

a first capacitor circuit coupled to a first control signal;

a second capacitor circuit coupled to a second control signal;

a third capacitor circuit coupled to a third control signal;

a fourth capacitor circuit coupled to an output of a loop filter;

wherein the control logic is responsive to the request to set the first control signal to a first value corresponding to a first capacitance that corresponds to a predetermined frequency of the oscillator output signal;

wherein the control logic is responsive to the request to set the second control signal to a second value corresponding to a second capacitance determined according to a measured temperature;

wherein the control logic is responsive to the request to set the third control signal to a third control value corresponding to a third capacitance determined according to a frequency difference between the predetermined frequency and the desired frequency; and with the first capacitor circuit, the second capacitor circuit, and the third capacitor circuit configured according to the first control signal, the second control signal, and the third control signal, respectively, the phase-locked loop tunes to the desired frequency by adjusting a fourth capacitance of the fourth capacitor circuit with a fourth control signal.

\* \* \* \* \*